United States Patent
Numazaki

(10) Patent No.: US 8,836,106 B2
(45) Date of Patent: Sep. 16, 2014

(54) SEMICONDUCTOR DEVICE

(71) Applicant: Renesas Electronics Corporation, Kanagawa (JP)

(72) Inventor: Masato Numazaki, Kanagawa (JP)

(73) Assignee: Renesas Electronics Corporation, Kawasaki-shi (JP)

(*) Notice: Subject to any disclaimer, the term of this patent is extended or adjusted under 35 U.S.C. 154(b) by 95 days.

(21) Appl. No.: 13/692,286

(22) Filed: Dec. 3, 2012

(65) Prior Publication Data

US 2013/0140714 A1 Jun. 6, 2013

(30) Foreign Application Priority Data

Dec. 1, 2011 (JP) ................. 2011-263744

(51) Int. Cl.
H01L 23/495 (2006.01)
H01L 23/00 (2006.01)
H01L 23/31 (2006.01)

(52) U.S. Cl.
CPC ..... *H01L 23/495* (2013.01); *H01L 2224/92247* (2013.01); *H01L 2224/45144* (2013.01); *H01L 2224/45139* (2013.01); *H01L 2224/97* (2013.01); *H01L 23/49548* (2013.01); *H01L 2224/32245* (2013.01); *H01L 2224/73265* (2013.01); *H01L 2224/49171* (2013.01); *H01L 23/3107* (2013.01); *H01L 24/97* (2013.01); *H01L 23/49541* (2013.01); *H01L 2224/48247* (2013.01)
USPC .... 257/695; 257/670; 257/735; 257/E23.014; 257/E23.043; 438/123

(58) Field of Classification Search
CPC .......... H01L 23/49537; H01L 23/49541; H01L 23/49548; H01L 23/4821; H01L 23/4822; H01L 23/4824; H01L 23/49838; H01L 23/49861
USPC .......... 257/670, 692, 695, 735, E23.014, 257/E23.043; 438/123
See application file for complete search history.

(56) References Cited

U.S. PATENT DOCUMENTS

| 2008/0199985 | A1* | 8/2008 | Retuta et al. | 438/113 |
| 2009/0032917 | A1* | 2/2009 | Ito | 257/670 |
| 2009/0079051 | A1* | 3/2009 | Amano et al. | 257/676 |
| 2011/0108969 | A1* | 5/2011 | Do et al. | 257/676 |
| 2012/0126384 | A1* | 5/2012 | Meng | 257/670 |

FOREIGN PATENT DOCUMENTS

JP 2010-177272 A 8/2010

* cited by examiner

*Primary Examiner* — Kimberly Rizkallah
*Assistant Examiner* — Maria Ligai
(74) *Attorney, Agent, or Firm* — Miles & Stockbridge P.C.

(57) ABSTRACT

In a QFN that includes a die pad, a semiconductor chip mounted on the die pad, a plurality of leads arranged around the semiconductor chip, a plurality of wires that electrically connect the plurality of electrode pads of the semiconductor chip with the plurality of leads, respectively, and a sealing member sealing the semiconductor chip and the plurality of wires, first and second step portions are formed at shifted positions on the left and right sides of each of the leads to make the positions of the first and second step portions shifted between the adjacent leads. As a result, the gap between the leads is narrowed, thereby achieving the miniaturization or the increase in the number of pins of the QFN.

10 Claims, 29 Drawing Sheets

SEMICONDUCTOR DEVICE

CROSS-REFERENCE TO RELATED APPLICATIONS

The present application claims priority from Japanese Patent Application No. 2011-263744 filed on Dec. 1, 2011, the content of which is hereby incorporated by reference into this application.

TECHNICAL FIELD

The present invention relates to a technique for a semiconductor device, and more particularly relates to a technique effectively applied to a semiconductor device having a structure in which a plurality of leads are arranged on a peripheral portion of a rear surface of a sealing member.

BACKGROUND

A structure of a thin QFN package in which an island and a semiconductor chip fixed onto the island are disposed such that lateral sides of the island and lateral sides of the semiconductor chip coincide with each other when seen in a plan view is disclosed in, for example, Japanese Patent Application Laid-Open Publication No. 2010-177272 (Patent Document 1).

SUMMARY

In semiconductor devices such as an SON (Small Outline Nonleaded package) type semiconductor device and a QFN (Quad Flat Non-leaded package) type semiconductor device having a structure in which leads serving as external terminals are exposed from a lower surface (mounting surface) of a sealing member, it is preferable to form a step portion (protruding portion, eave portion) on a peripheral edge portion (side surface and tip surface) of each of the leads as described in, for example, Patent Document 1 so as to prevent the leads from dropping off (being separated) from the sealing member.

According to the examinations by the inventor of the present application, it is found that this step portion is particularly effective when formed on the both sides (two side surfaces in an extending direction of the leads) of the lead.

In recent years, however, along with the miniaturization and the increase in the number of pins of the semiconductor device, the gap between mutually adjacent leads becomes small (narrow), and thus it becomes difficult to form a step portion on the both sides (two side surfaces) of the lead like that described in Patent Document 1. More specifically, when the gap between the mutually adjacent leads becomes narrow, it is difficult to realize the structure in which a step portion is formed on the peripheral edge portion (side surface) of the lead like that described in Patent Document 1.

An object of the present invention is to provide a technique capable of achieving the miniaturization or the increase in the number of pins of the semiconductor device.

Another object of the present invention is to provide a technique capable of preventing the leads in the semiconductor device from dropping off.

The other objects and novel characteristics of the present invention will be apparent from the description of the present specification and the accompanying drawings.

The following is a brief description of an outline of the typical means for solving the problems disclosed in the present application.

A semiconductor device according to a typical embodiment includes: a die pad; a plurality of leads; a semiconductor chip mounted on an upper surface of the die pad; a plurality of wires electrically connecting the plurality of electrode pads of the semiconductor chip with the plurality of leads, respectively; and a sealing member sealing the semiconductor chip and the plurality of wires. Furthermore, each of the plurality of leads has a first portion located on an inner end surface side in an extending direction of each of the plurality of leads, and a second portion located on an outer end surface side than the first portion, and a first step portion is formed on a first side surface of a first portion and a second step portion is formed on a second side surface of a second portion. Also, the first and second step portions are not formed on the first side surface of the second portion, and the first and second step portions are not formed on the second side surface of the first portion.

The effects obtained by typical embodiments of the invention disclosed in the present application will be briefly described below.

It becomes possible to achieve the miniaturization or the increase in the number of pins of a semiconductor device.

Moreover, it is also possible to prevent the leads in a semiconductor device from dropping off.

DETAILED DESCRIPTION

In the embodiments described below, the description of the same or similar portions is not repeated in principle unless particularly required.

Furthermore, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Also, even when mentioning that constituent elements or the like "are made of A", "are made up of A", "are provided with A", or "include A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof will be omitted. Also, hatching is used even in a plan view so as to make the drawings easy to see.

First Embodiment

Figure 1:
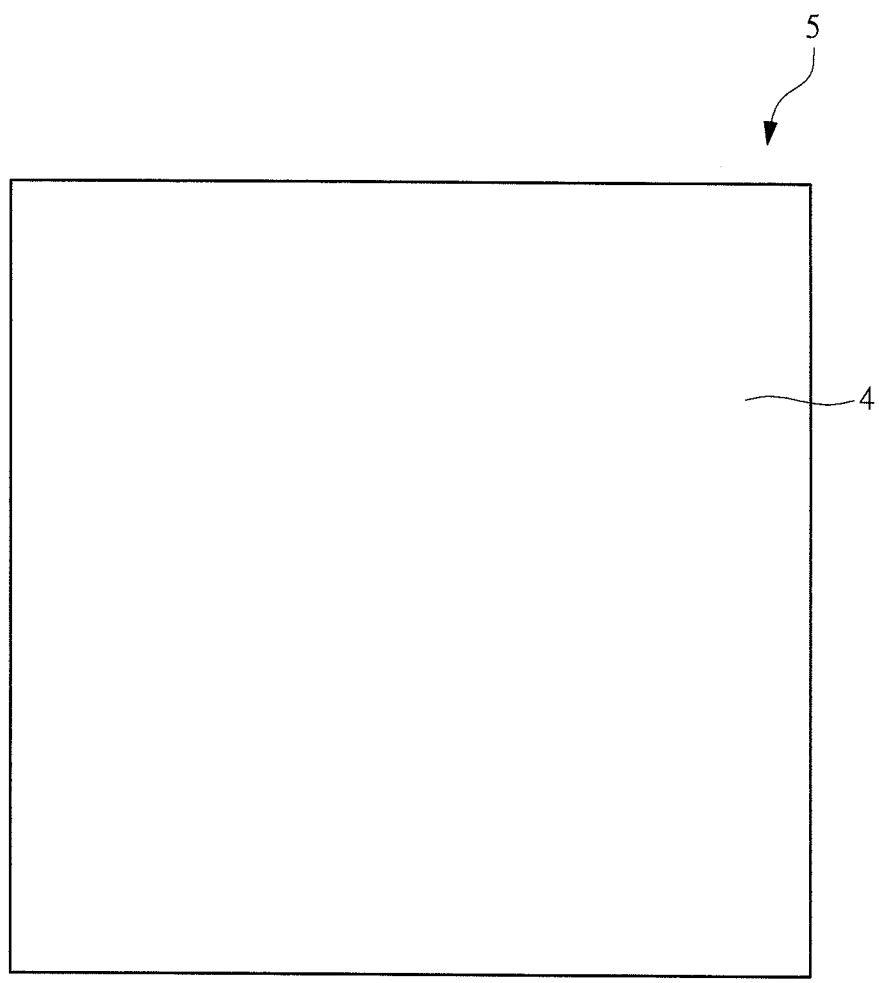
FIG. 1 is a plan view showing one example of a structure of a semiconductor device of the first embodiment of the present invention.
Figure 2:
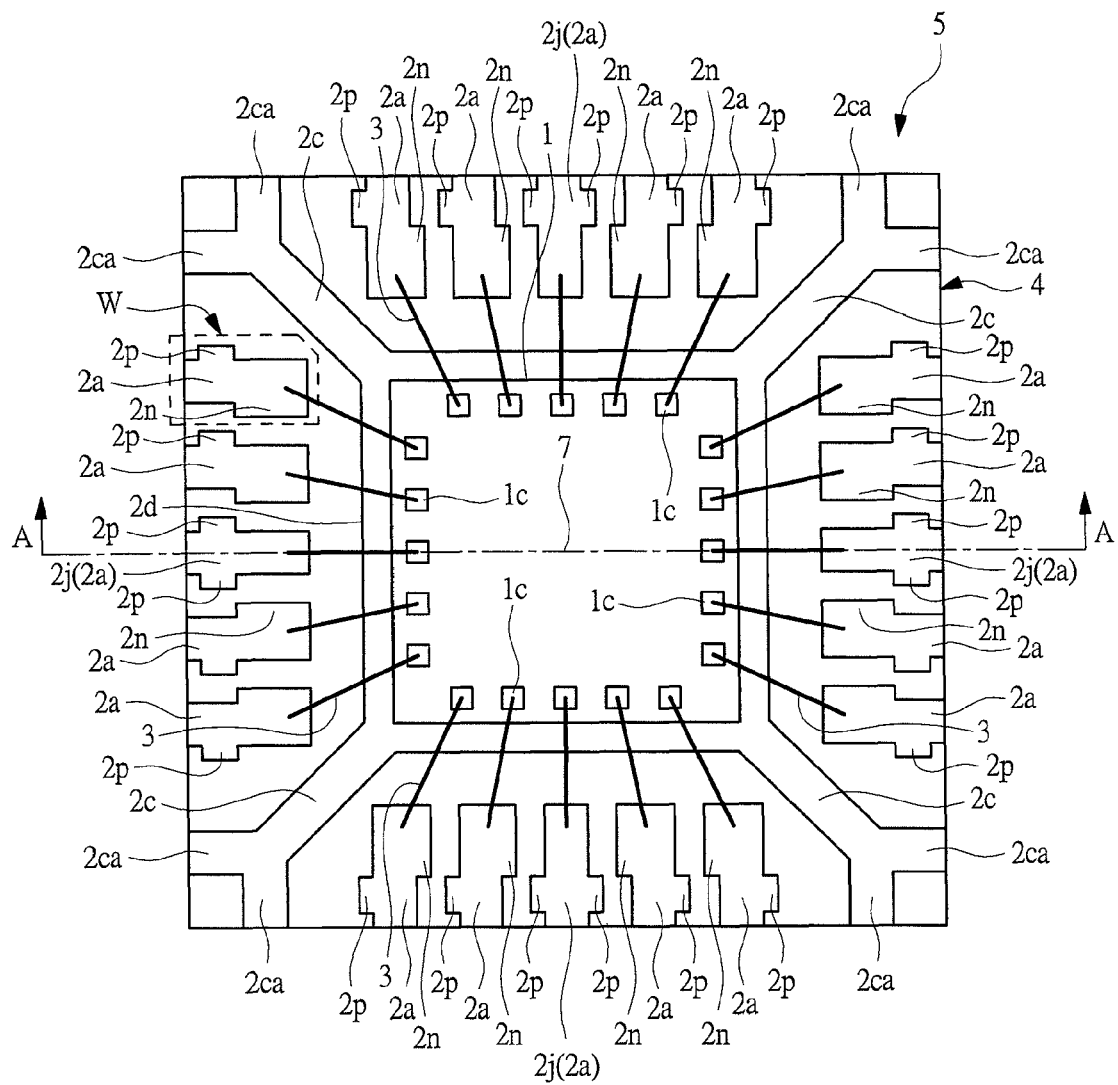
FIG. 2 is a plan view showing the structure of the semiconductor device of FIG. 1 in a transparent manner through a sealing member.
Figure 3:
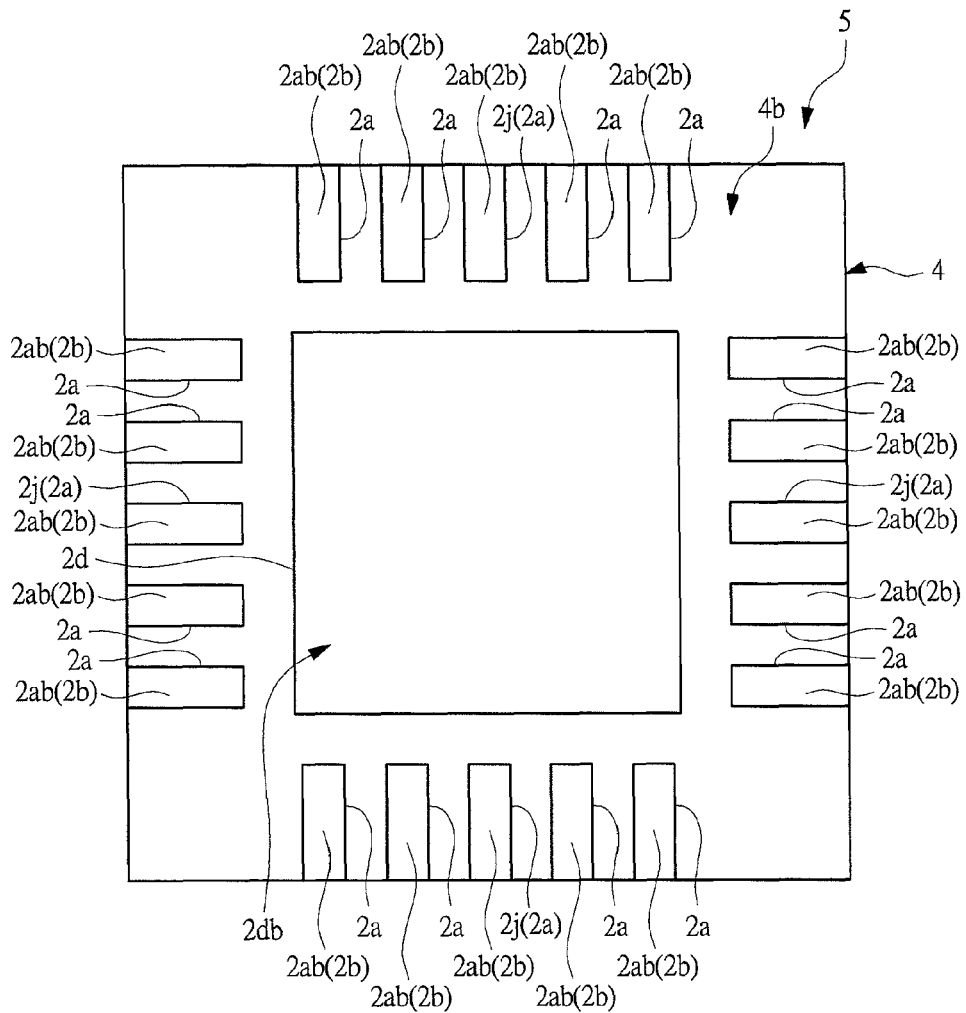
FIG. 3 is a rear-surface view showing one example of the structure of the semiconductor device of FIG. 1.
Figure 4:
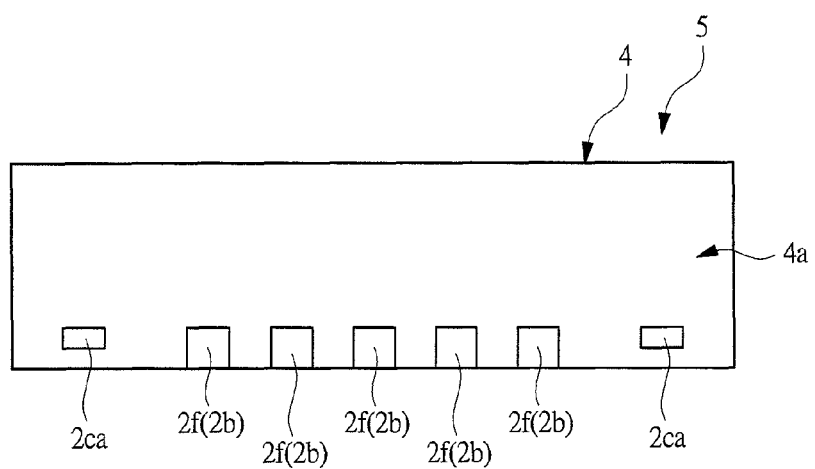
FIG. 4 is a side view showing one example of the structure of the semiconductor device of FIG. 1.
Figure 5:
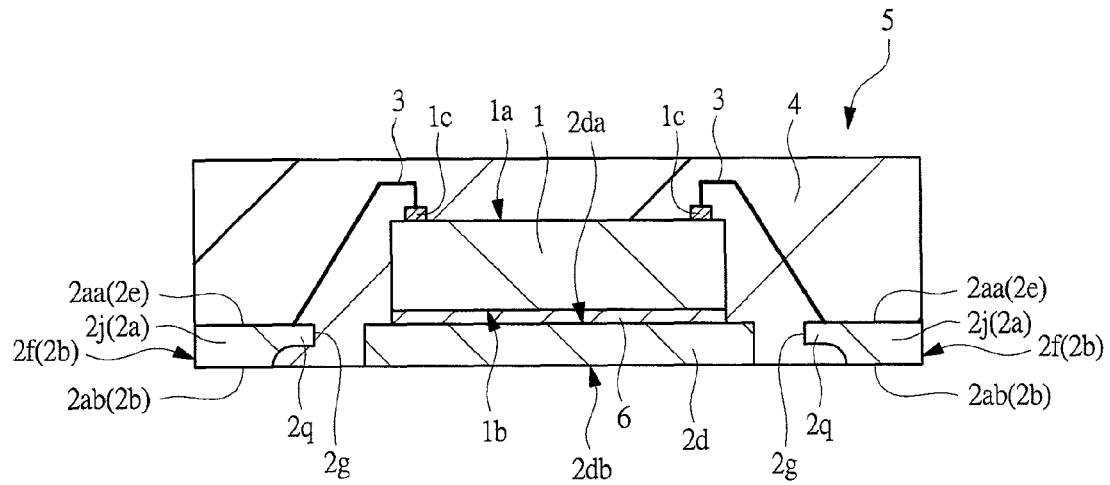
FIG. 5 is a cross-sectional view showing one example of the structure taken along the line A-A of FIG. 2.
Figure 6:
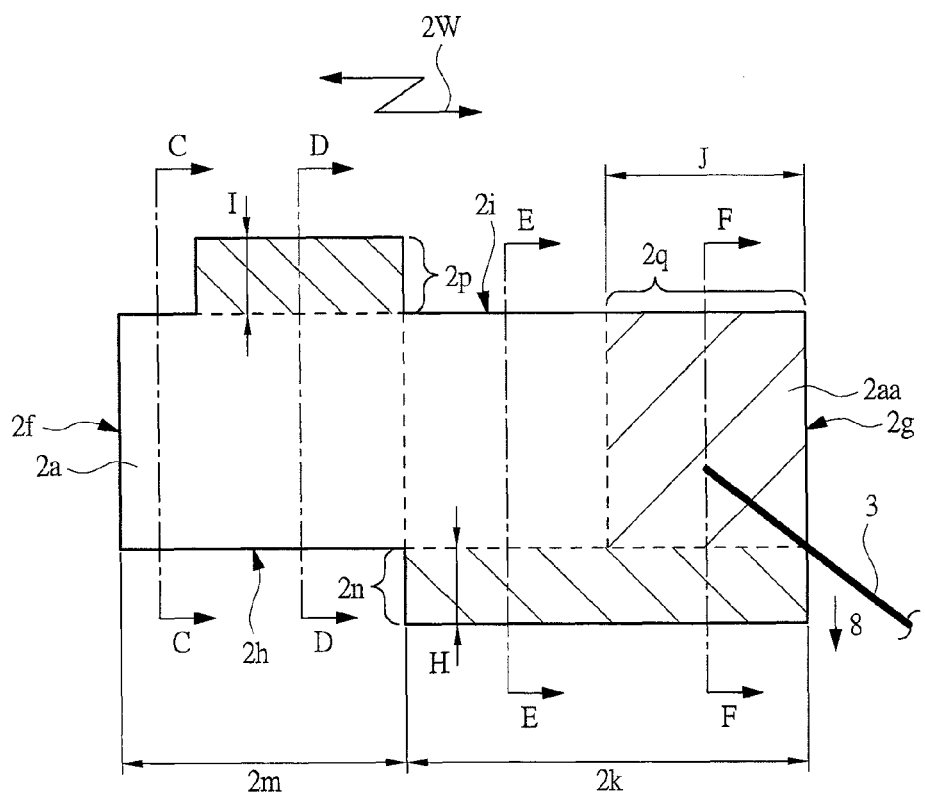
FIG. 6 is an enlarged partial plan view showing a structure of a W portion of FIG. 2.
Figure 7:
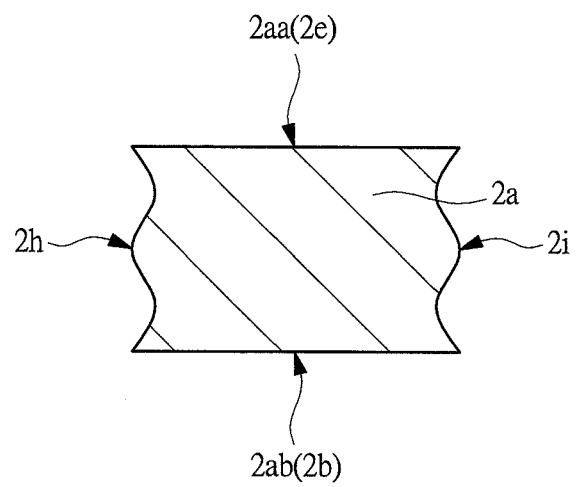
FIG. 7 is a cross-sectional view showing one example of the structure taken along the line C-C of FIG. 6.
Figure 8:
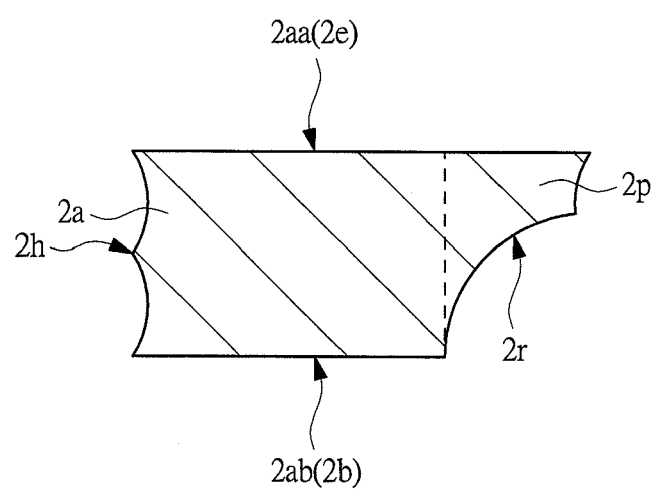
FIG. 8 is a cross-sectional view showing one example of the structure taken along the line D-D of FIG. 6.
Figure 9:
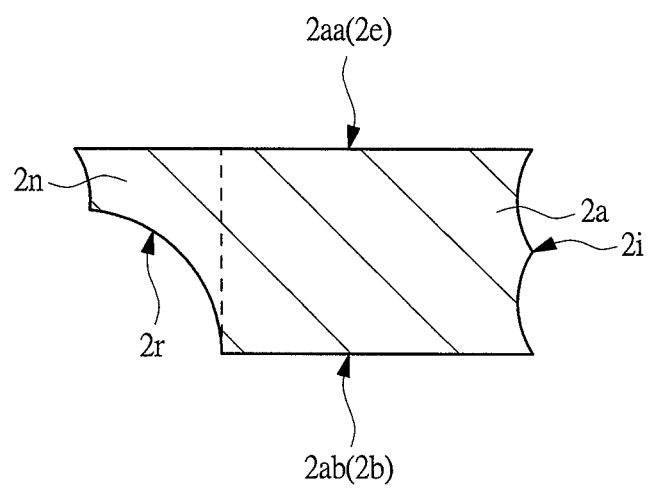
FIG. 9 is a cross-sectional view showing one example of the structure taken along the line E-E of FIG. 6.
Figure 10:
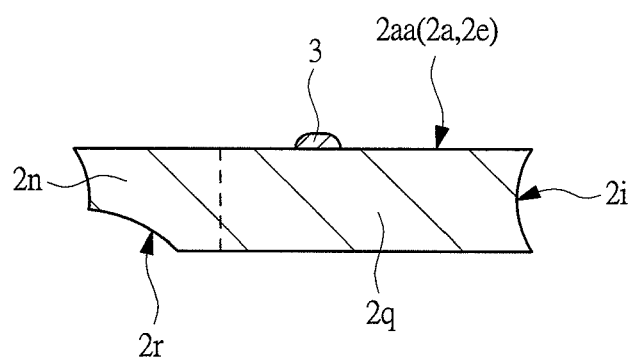
FIG. 10 is a cross-sectional view showing one example of the structure taken along the line F-F of FIG. 6.

FIG. 1 is a plan view showing one example of a structure of a semiconductor device of the first embodiment of the present invention, FIG. 2 is a plan view showing the structure of the semiconductor device of FIG. 1 in a transparent manner through a sealing member, FIG. 3 is a rear-surface view showing one example of the structure of the semiconductor device of FIG. 1, FIG. 4 is a side view showing one example of the structure of the semiconductor device of FIG. 1, and FIG. 5 is a cross-sectional view showing one example of the structure taken along the line A-A of FIG. 2. Also, FIG. 6 is an enlarged partial plan view showing a structure of a W portion of FIG. 2, FIG. 7 is a cross-sectional view showing one example of the structure taken along the line C-C of FIG. 6, FIG. 8 is a cross-sectional view showing one example of the structure taken along the line D-D of FIG. 6, FIG. 9 is a cross-sectional view showing one example of the structure taken along the line E-E of FIG. 6, and FIG. 10 is a cross-sectional view showing one example of the structure taken along the line F-F of FIG. 6.

First, a structure of a semiconductor device according to the present first embodiment will be described.

The semiconductor device of the present first embodiment shown in FIGS. 1 to 5 is of a peripheral type in which one portion of each of a plurality of leads 2a serving as external terminals is arranged on a peripheral edge portion on a rear-surface side of the semiconductor device when seen in a plan view, and a QFN 5 of a resin sealed-type in which a semiconductor chip 1 and the like are sealed with resin will be described as an example.

The structure of the QFN 5 will be described below in detail. That is, the QFN 5 includes: a die pad 2d (referred to also as a tab) serving as a plate-like chip mounting portion having a virtually square shape in its planar shape shown in FIG. 2 and FIG. 3; a plurality of suspension leads 2c supporting the die pad 2d (coupled to the die pad 2d); a plurality of leads 2a arranged around the die pad 2d and also located between the adjacent suspension leads 2c out of the plurality of suspension leads 2c; a semiconductor chip 1 having a structure in which a plurality of electrode pads (bonding pads) 1c are formed on a surface (main surface) 1a shown in FIG. 5; and a plurality of wires 3 that electrically connect the plurality of electrode pads 1c of the semiconductor chip 1 with the plurality of leads 2a, respectively.

Additionally, as shown in FIG. 2 and FIG. 5, the semiconductor chip 1 has the surface 1a and a rear surface 1b opposite to the surface 1a, and a semiconductor integrated circuit is formed therein. Moreover, the plurality of electrode pads 1c formed on the surface 1a are arranged side by side on the peripheral edge portion of the surface 1a along each of the four sides of the square surface 1a as shown in FIG. 2.

As shown in FIG. 5, the semiconductor chip 1 is mounted on an upper surface 2da serving as a chip mounting surface of the die pad 2d with a die bond material (adhesive material) 6 such that a rear surface 1b of the semiconductor chip 1 faces the upper surface 2da, and as shown in FIG. 2, the plurality of electrode pads 1c and the plurality of leads 2a corresponding thereto are electrically connected with each other through the plurality of wires 3.

Moreover, as shown in FIGS. 3 to 5, the QFN 5 has a sealing member 4 sealing the semiconductor chip 1, the plurality of wires 3, portions of the die pad 2d and portions of the leads 2a. The sealing member 4 is made of sealing resin, and the planar shape of the sealing member 4 is a virtually square shape as shown in FIG. 1.

Also, in the QFN 5, a lower surface 2db of the die pad 2d opposite to the upper surface 2da is exposed on a lower surface 4b of the sealing member 4 as shown in FIG. 3 and FIG. 5. In other words, the QFN 5 is a semiconductor package of a die pad exposed type (tab exposed type). Moreover, the upper surface 2da of the die pad 2d is larger than the surface 1a of the semiconductor chip 1, which forms a so-called large tab structure.

Moreover, since the QFN 5 is of the peripheral type, a plurality of lower surfaces (mounting surfaces) 2ab of the respective leads 2a exposed from the sealing member 4 are arranged side by side on the peripheral edge portion of the lower surface 4b of the sealing member 4 as shown in FIG. 3.

Also, as shown in FIG. 5, each of the leads 2a has an outer portion 2b exposed as an external terminal from the lower surface 4b of the sealing member 4 and an inner portion 2e serving as a portion to be embedded in the sealing member 4, to which the wire 3 is connected. In other words, in each of the plurality of leads 2a, its lower surface 2ab is exposed from the lower surface 4b of the sealing member 4 as the outer portion 2b as shown in FIG. 3, while its upper surface 2aa serving as one portion of the inner portion 2e embedded in the sealing member 4 forms a wire connecting surface, and the wire 3 is connected to this upper surface 2aa.

As shown in FIG. 4, one end of the outer portion 2b of each lead 2a opposite to the die pad 2d side is exposed from the side surface 4a of the sealing member 4 as an outer end surface (cut surface formed by cutting the lead 2a) 2f.

In the outer portion 2b of each of the plurality of leads 2a, an exterior plated layer such as a solder plated layer is formed on each of the lower surfaces 2ab exposed from the lower surface 4b side of the sealing member 4.

Moreover, as shown in FIG. 2, in the QFN 5, each of the plurality of suspension leads 2c extends from each of the corners of the die pad 2d toward each of the corners of the sealing member 4 when seen in a plan view.

More specifically, the suspension leads 2c are connected to the four corners of the virtually square-shaped die pad 2d on which the semiconductor chip 1 is mounted, and thus, in the QFN 5, the die pad 2d is supported with its corner portions by the four suspension leads 2c arranged on its diagonal lines.

Therefore, in the QFN 5 of the present first embodiment, the plurality of leads 2a are arranged side by side in an area between the two adjacent suspension leads 2c so as to correspond to each of the four sides of the semiconductor chip 1.

In this case, each of the four suspension leads 2c is thinly formed on its lower surface side by a half etching process. Therefore, since the resin flows around also to the lower surface side in the resin sealing process, the suspension leads 2c are not exposed from the lower surface 4b of the sealing member 4 as shown in FIG. 3. Moreover, each of the suspension leads 2c has its tip portion branched into a fork shape, and each of the branched suspension leads 2ca is exposed from the side surface 4a of the sealing member 4 as shown in FIG. 4.

Next, the lead shape of the QFN 5 of the present first embodiment will be described in detail with reference to FIGS. 6 to 10.

As shown in FIG. 1 and FIG. 2, in the QFN 5 of the present first embodiment, the planar shape of the sealing member 4 is a square shape, and the present first embodiment exemplifies a structure in which the plurality of leads 2a are arranged such that an odd number of the leads 2a are arranged along each side of the sealing member 4 when seen in a plan view. Moreover, in the present first embodiment, a structure in which five leads 2a are arranged on each side is exemplified as a matter of convenience. However, in the case of the multi-pin QFN 5, several tens or more leads 2a may be arranged on each side in some cases, and it is needless to say that such a multi-pin QFN 5 is also included in the present invention.

In the QFN 5 of the present first embodiment, a lead pattern in its plan view of the plurality of leads 2a is formed so as to have a line symmetrical shape with respect to a central lead 2j of the odd number of leads 2a (5 leads in this case) on each side (for example, line symmetry with respect to a center line (virtual line) 7). More specifically, as shown in FIG. 2, the five leads 2a on each side of the square-shaped QFN 5 are arranged so as to form a line symmetrical lead pattern with respect to the central lead (lead arranged in the center of each side of the semiconductor device 5 having a square shape in its planar shape) 2j and the plurality of leads 2a on the left and right sides of the central lead 2j.

In this case, in the QFN 5, as shown in FIG. 5, each of the plurality of leads 2a including the central lead 2j on each side includes a lower surface 2ab exposed from the sealing member 4, an upper surface 2aa opposite to the lower surface 2ab, an inner end surface 2g located between the upper surface 2aa and the lower surface 2ab and facing the die pad 2d, and an outer end surface 2f opposite to the inner end surface 2g and exposed from the sealing member 4. Moreover, it further includes a side surface (first side surface) 2h shown in FIG. 6 located between the upper surface 2aa and the lower surface 2ab and located between the inner end surface 2g and the outer end surface 2f and a side surface (second side surface) 2i opposite to the side surface 2h.

In other words, each of the plurality of leads 2a including the central lead 2j has the lower surface 2ab, the upper surface 2aa, the inner end surface 2g and the outer end surface 2f shown in FIG. 5 as well as the side surface 2h and the side surface 2i shown in FIG. 6.

Moreover, each of the plurality of leads 2a including the central lead 2j includes a tip portion (first portion) 2k positioned on the inner end surface 2g side and a rear end portion (second portion) 2m positioned on the outer end surface 2f side than the tip portion 2k in the extending direction 2w of the leads 2a as shown in FIG. 6.

In addition, in the QFN 5 of the present first embodiment, on each of the plurality of leads 2a except for the central lead 2*j* on each side, a step portion (a first step portion, a protruding portion, a projecting portion, an eave portion) 2*n* as shown in FIG. 9 and FIG. 10 is formed on the side surface 2*h* of the tip portion 2*k* on the upper surface 2*aa* side than the lower surface 2*ab* (hatched portion shown FIG. 6). More specifically, on each of the side surfaces 2*h* on the tip portion 2*k* side of the leads 2*a* except for the central lead 2*j* on each side, a projecting (protruding) step portion 2*n* toward the central lead 2*j* is formed.

On the other hand, on each of the plurality of leads 2*a* except for the central lead 2*j*, a step portion (a second step portion, a protruding portion, a projecting portion, an eave portion) 2*p* as shown in FIG. 8 is formed on the side surface 2*i* of the rear end portion 2*m* on the upper surface 2*aa* side than the lower surface 2*ab* (hatched portion shown FIG. 6). More specifically, on each of the side surfaces 2*i* on the rear end portion 2*m* side of the leads 2*a* except for the central lead 2*j* on each side, a projecting (protruding) step portion 2*p* is formed in a direction away from the central lead 2*j*.

In the present embodiment, as shown in FIGS. 8 to 10, each of the step portions 2*n* and 2*p* is formed so as to be located not on the lower surface (mounting surface) side from a half (center) of the thickness of the lead 2*a*, but on the upper surface side thereof in the portion in which the respective step portions 2*n* and 2*p* are formed. However, from only the viewpoint of preventing the dropping off of the leads, it is only necessary to dispose one portion of the sealing member 4 under the lower surface of each of the step portions 2*n* and 2*p*. In other words, as long as the lower surface of each of the step portions 2*n* and 2*p* is not the same surface as the lower surface (mounting surface) of the lead 2*a*, the step portions 2*n* and 2*p* are not necessarily positioned on the upper surface side from the center of the thickness of the lead 2*a*. However, since the prevention against the dropping off of the leads becomes more effective as the thickness (amount) of the sealing member 4 positioned under the lower surface of each of the step portions 2*n* and 2*p* becomes larger, the positions as described in the present embodiment are preferable as the formation positions on the side surface of the lead 2*a*, on which respective step portions 2*n* and 2*p* are formed (see FIGS. 8 to 10).

Moreover, in each of the plurality of leads 2*a* except for the central lead 2*j*, on the side surface 2*h* of the rear end portion 2*m*, none of the step portion 2*n* and the step portion 2*p* is formed as shown in FIG. 8. Furthermore, on the side surface 2*i* of the tip portion 2*k*, none of the step portion 2*n* and the step portion 2*p* is formed as shown in FIGS. 9 and 10.

As described above, on each side, on each of the plurality of leads 2*a* except for the central lead 2*j*, the step portion 2*n* is formed only on the side surface 2*h* of the tip portion 2*k*, while the step portion 2*p* is formed only on the side surface 2*i* of the rear end portion 2*m*.

Therefore, by continuously forming the lead patterns side by side in the plan view, the step portions 2*n* and 2*p* are formed at shifted positions on the left and right sides of each of the leads 2*a*. In other words, since the positions of the step portions 2*n* and 2*p* are shifted between the adjacent leads 2*a*, while maintaining a structure in which any of the step portions 2*n* and 2*p* are placed on the both sides of the leads 2*a*, the distance between the adjacent leads 2*a* can be narrowed as small as possible.

Also, with respect to the central lead 2*j* of each side, as shown in FIG. 2, the step portion 2*p* is formed on each of the two side surfaces 2*h* and 2*i* of the rear end portion 2*m* of FIG. 6. More specifically, the step portion 2*p* is formed on both of the left and right side surfaces of the rear end portion 2*m*.

As described above, in the QFN 5 of the present first embodiment, as shown in FIG. 2, the respective step portions 2*n* and step portions 2*p* are formed such that the lead pattern of the five leads 2*a* of each side seen in a plan view forms a line symmetrical shape with respect to the central lead 2*j* and the plurality of leads 2*a* on the left and right sides of the central lead 2*j*.

Moreover, in the QFN 5 of the present first embodiment, the step portion 2*p* formed on each of the side surfaces 2*i* of the rear end portion 2*m* of the plurality of leads 2*a* on each side and the step portion 2*p* formed on each of left and right sides of the rear end portion 2*m* of the central lead 2*j* are both terminated inside the sealing member 4 (as shown in the cross-sectional view of FIG. 7, no step portions 2*n* and 2*p* is formed at edge portions of each of the leads 2*a* on the periphery of the sealing member 4). In other words, in all the leads 2*a* on each side, the step portions 2*p* of the respective rear end portions 2*m* are terminated within a range that does not reach (that is not exposed from) the side surface 4*a* of the sealing member 4 as shown in FIG. 4.

Moreover, in the QFN 5 of the present first embodiment, as shown in FIG. 5, on the lower surface 2*ab* of the tip portion 2*k* of each of the leads 2*a* on each side, a step portion (a third step portion, a protruding portion, a projecting portion, an eave portion) 2*q* that is continuous with the inner end surface 2*g* is formed (hatched portion shown FIG. 6). More specifically, on each of the lower surfaces 2*ab* on the tip portion 2*k* side (die pad 2*d* side) of the leads 2*a* including the central lead 2*j* on each side, a projecting (protruding) step portion 2*q* toward the die pad 2*d* is formed.

In this case, in each of the plurality of leads 2*a*, the projecting amount (protruding amount) of the step portion 2*q* toward the die pad 2*d* is larger than the projecting amount (protruding amount) of the step portion 2*n* toward the adjacent lead 2*a* and the projecting amount (protruding amount) of the step portion 2*p* toward the adjacent lead 2*a*.

More specifically, as shown in FIG. 6, in the respective leads 2*a*, a relationship that the projecting amount J of the step portion 2*q* is larger than the projecting amount H of step portion 2*n* and the projecting amount I of the step portion 2*p* (J>H, I) is satisfied.

This is because, in each of the leads 2*a*, there is a distance to the die pad 2*d* on the tip portion 2*k* side (die pad 2*d* side) and the projecting amount can be made larger, while in contrast, on the left and right sides of the lead 2*a*, the lead-to-lead pitch between adjacent leads 2*a* is narrow in the case of multi pins and the projecting amount cannot be made large.

For example, the projecting amount (protruding amount) of the step portion (protruding portion, projecting portion, eave portion) 2*q* of the tip portion (first portion, portion positioned on the die pad 2*d* side) 2*k* of each of the leads 2*a* is 0.2 mm (in this case, the exposed length of the lower surface 2*ab* of the lead 2*a* is 0.47 mm). Also, the projecting amount (protruding amount) of the step portions 2*n* and 2*p* on the both sides (side surfaces 2*h* and 2*i*) of the lead 2*a* is 0.05 mm.

Moreover, in the plurality of leads 2*a* of FIG. 6 except for the central lead 2*j* on each side, the side surface 2*h* on which the step portion 2*n* is formed is located on the side corresponding to the extending direction 8 of the wire 3. That is, it is preferable that the side surface 2*h* is disposed on the side corresponding to the extending direction 8 in each of the plurality of leads 2*a* on each side and the step portion 2*n* is formed on the side surface 2*h* of the tip portion 2*k*, and it is further preferable that the side on which the step portion 2*n* is formed coincides with the side corresponding to the extending direction 8 of the wire 3 in the tip portion 2*k* of each of the leads 2*a*.

In this manner, since the step portion 2*n* (side surface 2*h*) is formed on the same side as the side corresponding to the extending direction 8 of the wire 3 in the plurality of leads 2a of each side, a lead pattern seen in a plan view of the five leads 2a on each side can be formed so as to have a line symmetrical shape with respect to the central lead 2j and the plurality of leads 2a located on the left and right sides of the central lead 2j.

Moreover, in the QFN 5, each of the plurality of leads 2a is preferably formed by an etching process. More specifically, the lead pattern of a lead frame 2 of FIG. 11 described later is preferably formed by the etching process. In other words, each of the plurality of leads 2a in the QFN 5 is preferably formed by the etching process.

By processing the step portions 2n, 2p and 2q by half etching when forming the leads 2a by the etching process, a projecting surface 2r of each of the step portions 2n, 2p and 2q shown in FIG. 8 and FIG. 9 can be formed into a surface having a curvature (curved surface). In this manner, because of the curvature prepared therein, the amount of sealing resin to be filled in a lower portion of the projecting surface 2r can be increased in the resin sealing process in comparison with the projecting surface formed by using a pressing treatment or the like.

Moreover, in each of the leads 2a, on the side surfaces 2h and 2i where no step portions 2n, 2p and 2q have been formed, etching solution flows to each lead 2a from both of the front and rear surface sides. Therefore, as shown in FIGS. 7 to 9, each of the leads 2a has such a cross-sectional shape in which curvature surfaces (curved surfaces) are formed up to near ½ of the thickness of the lead 2a.

In the QFN 5 of the present embodiment, the leads 2a, suspension leads 2c and die pad 2d are made of, for example, copper alloy, but these may be made of alloy other than the copper alloy such as iron-nickel alloy or the like. Also, the wire 3 is made of, for example, a gold wire or the like. Moreover, the sealing member 4 is formed of sealing resin such as epoxy-based resin or the like.

Next, a method of manufacturing the QFN (semiconductor device) 5 of the present first embodiment will be described.

Figure 11:
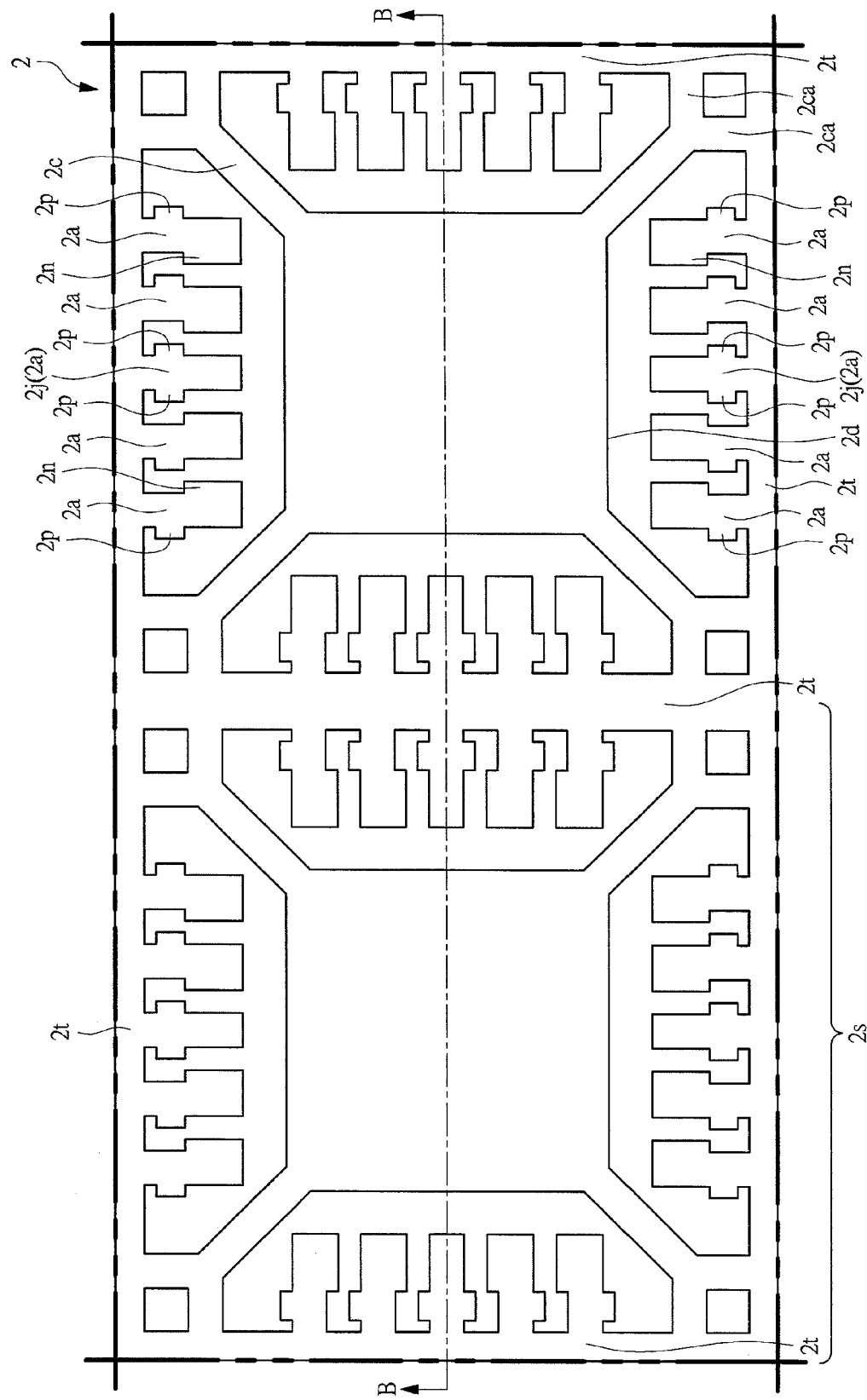
FIG. 11 is a partial plan view showing one example of a lead frame structure to be used for an assembling process of the semiconductor device of FIG. 1.
Figure 12:
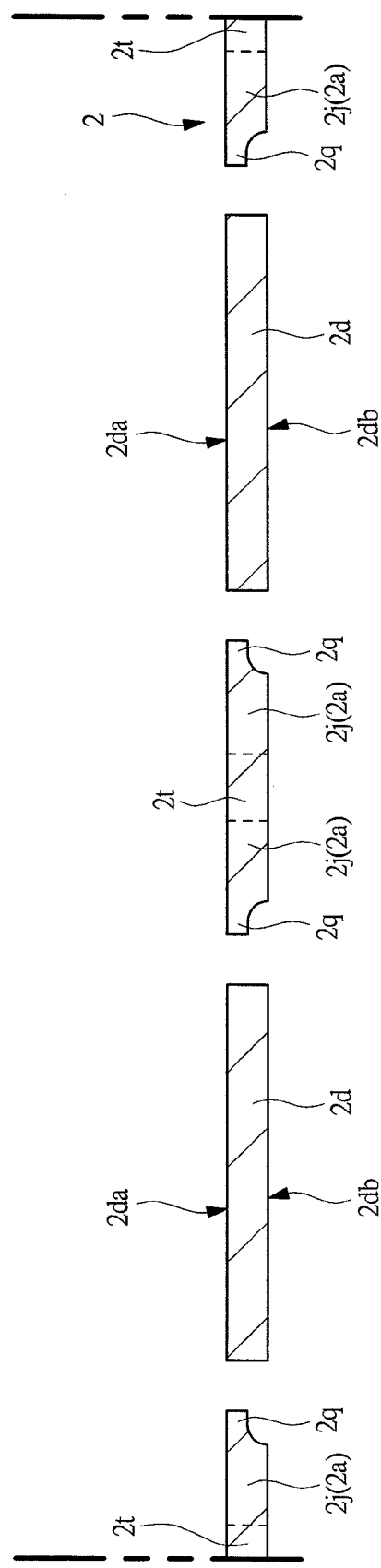
FIG. 12 is a partial cross-sectional view showing one example of the structure taken along the line B-B of FIG. 11.
Figure 13:
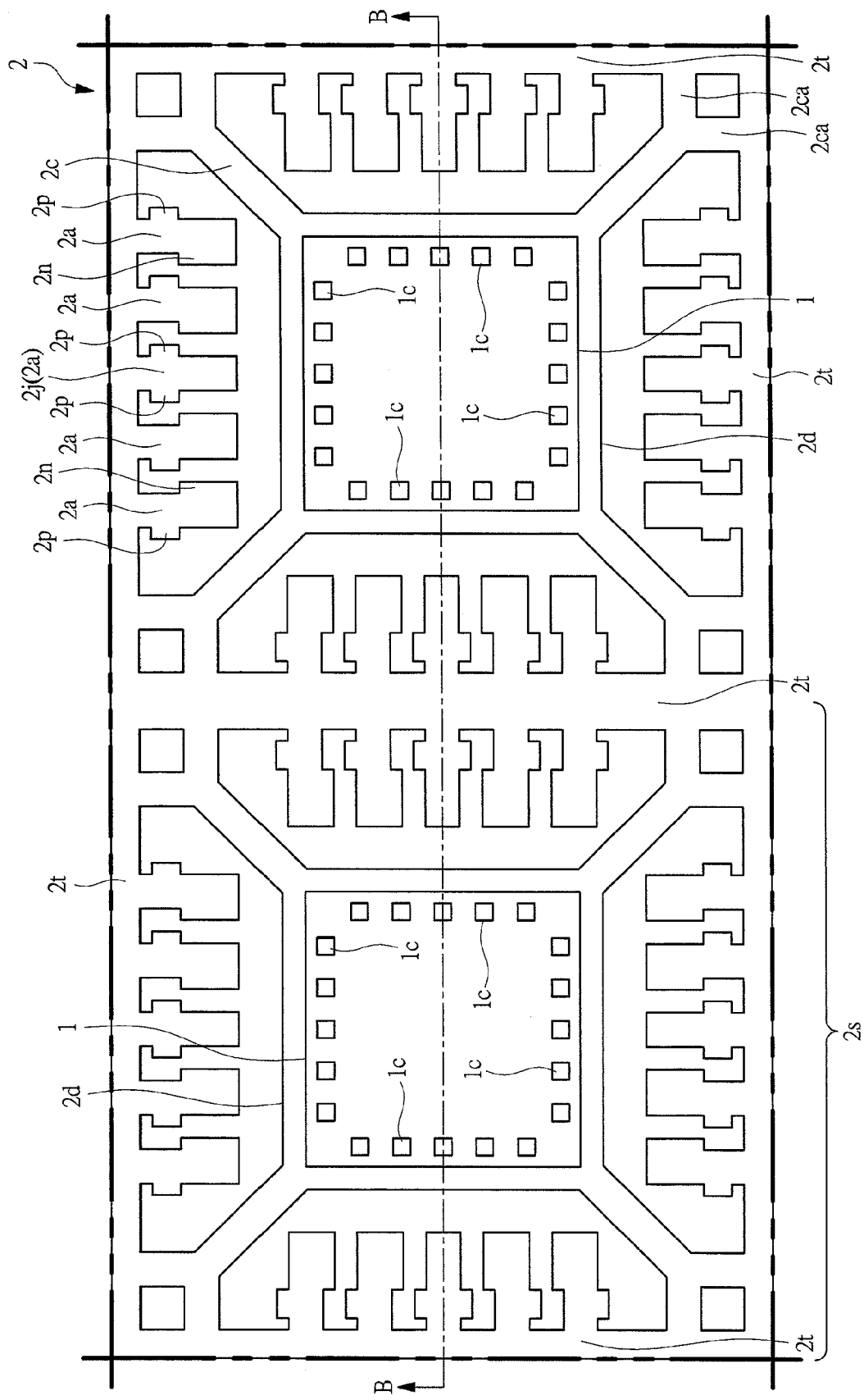
FIG. 13 is a partial plan view showing one example of a structure after die bonding in the assembling process of the semiconductor device of FIG. 1.
Figure 14:
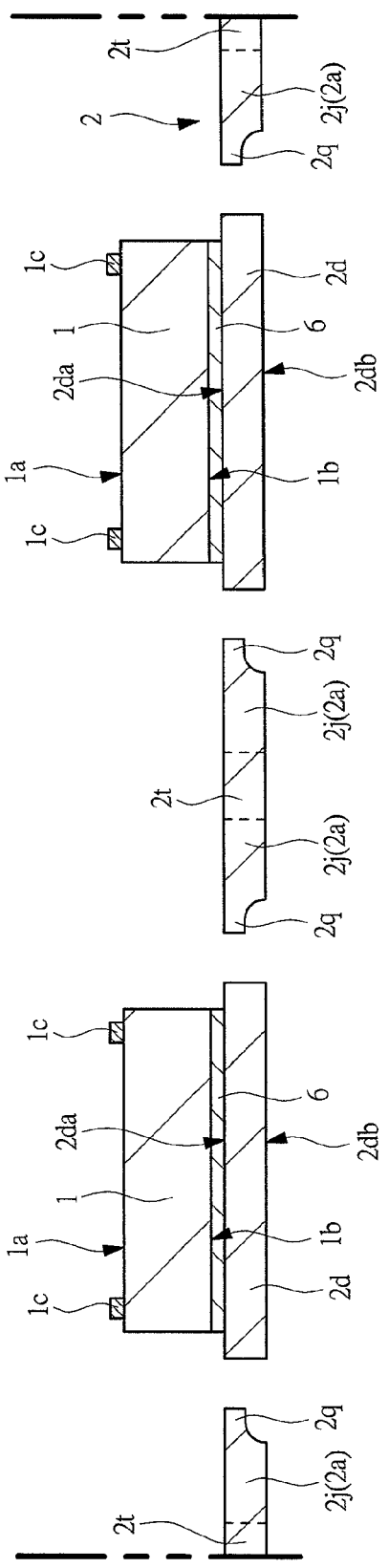
FIG. 14 is a partial cross-sectional view showing one example of the structure taken along the line B-B of FIG. 13.
Figure 15:
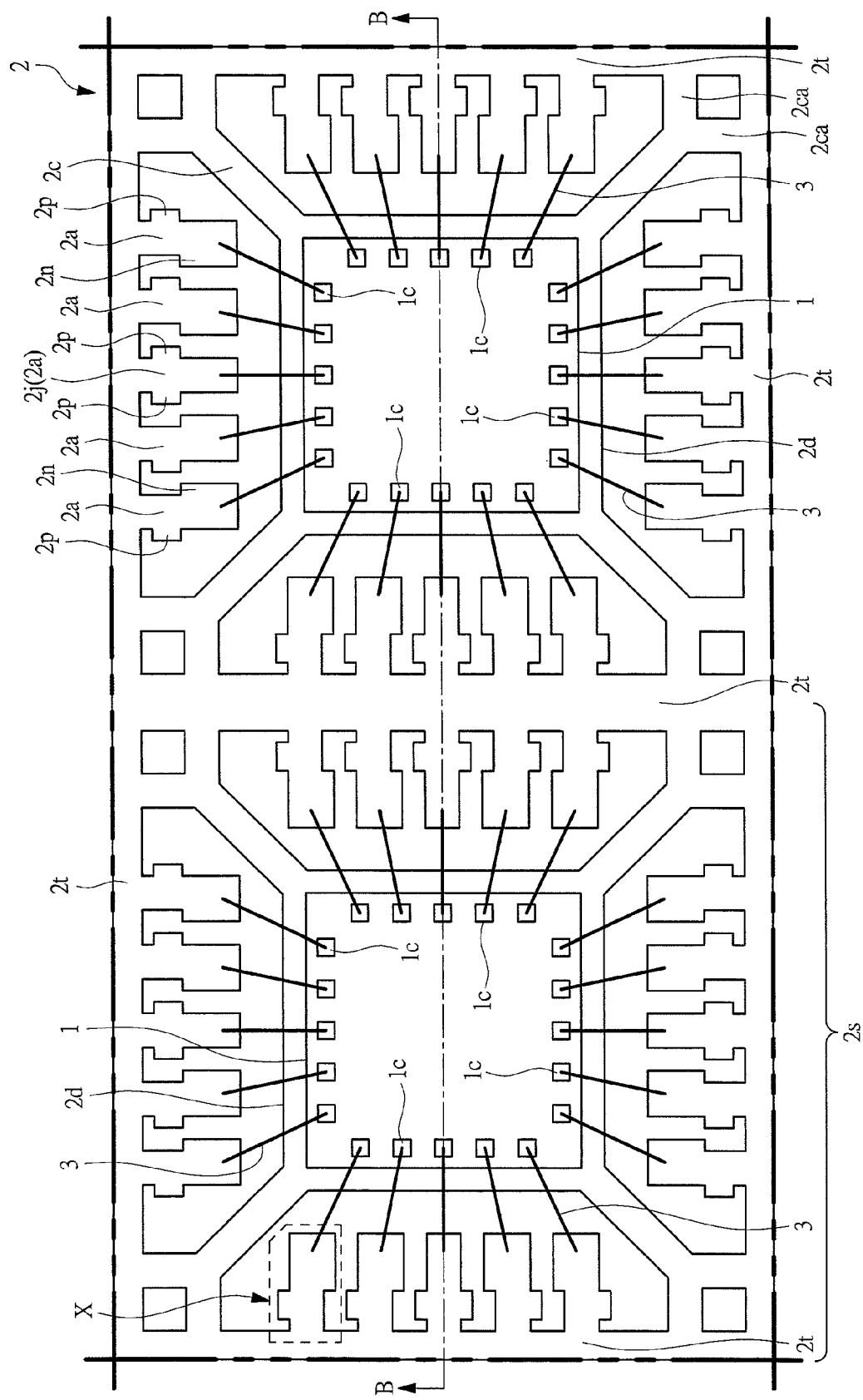
FIG. 15 is a partial plan view showing one example of a structure after wire bonding in the assembling process of the semiconductor device of FIG. 1.
Figure 16:
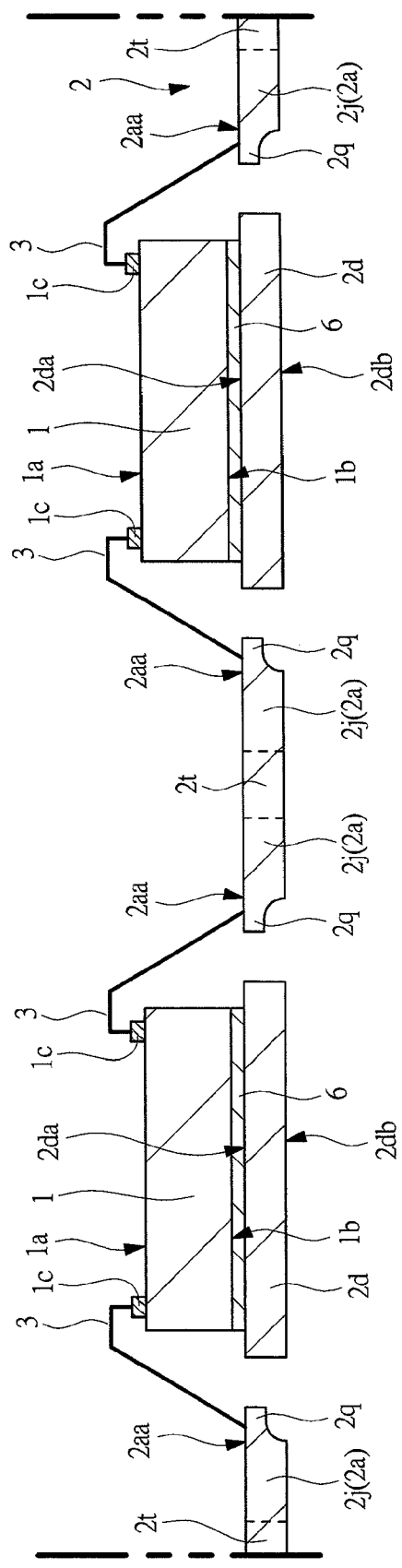
FIG. 16 is a partial cross-sectional view showing one example of the structure taken along the line B-B of FIG. 15.
Figure 17:
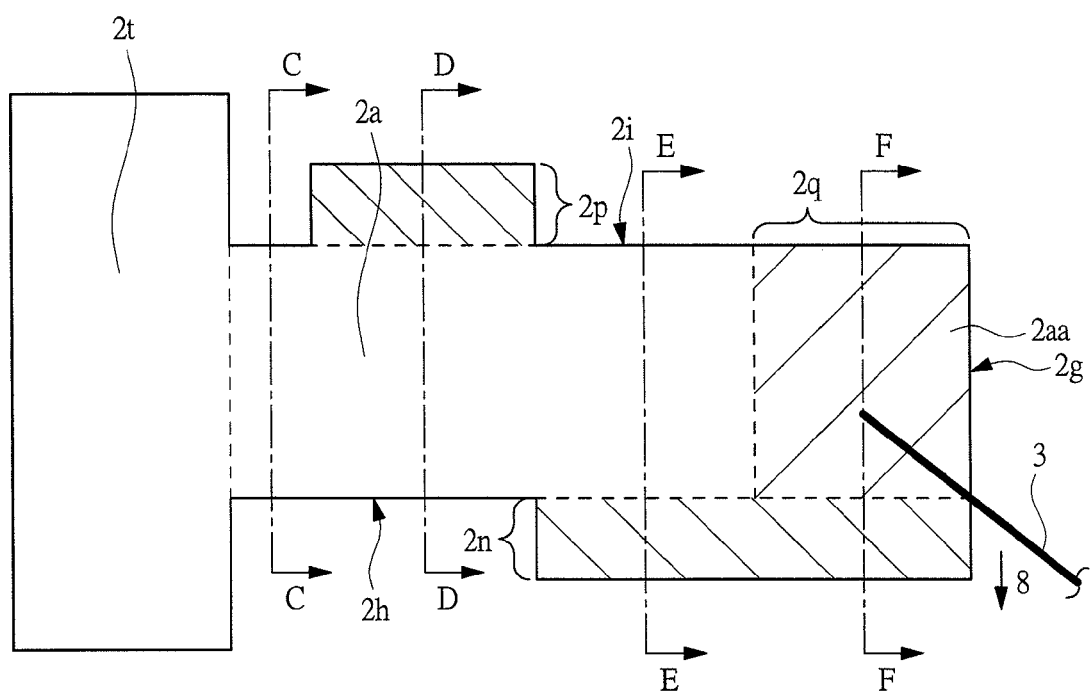
FIG. 17 is a partially enlarged plan view showing a structure of an X portion of FIG. 15.
Figure 18:
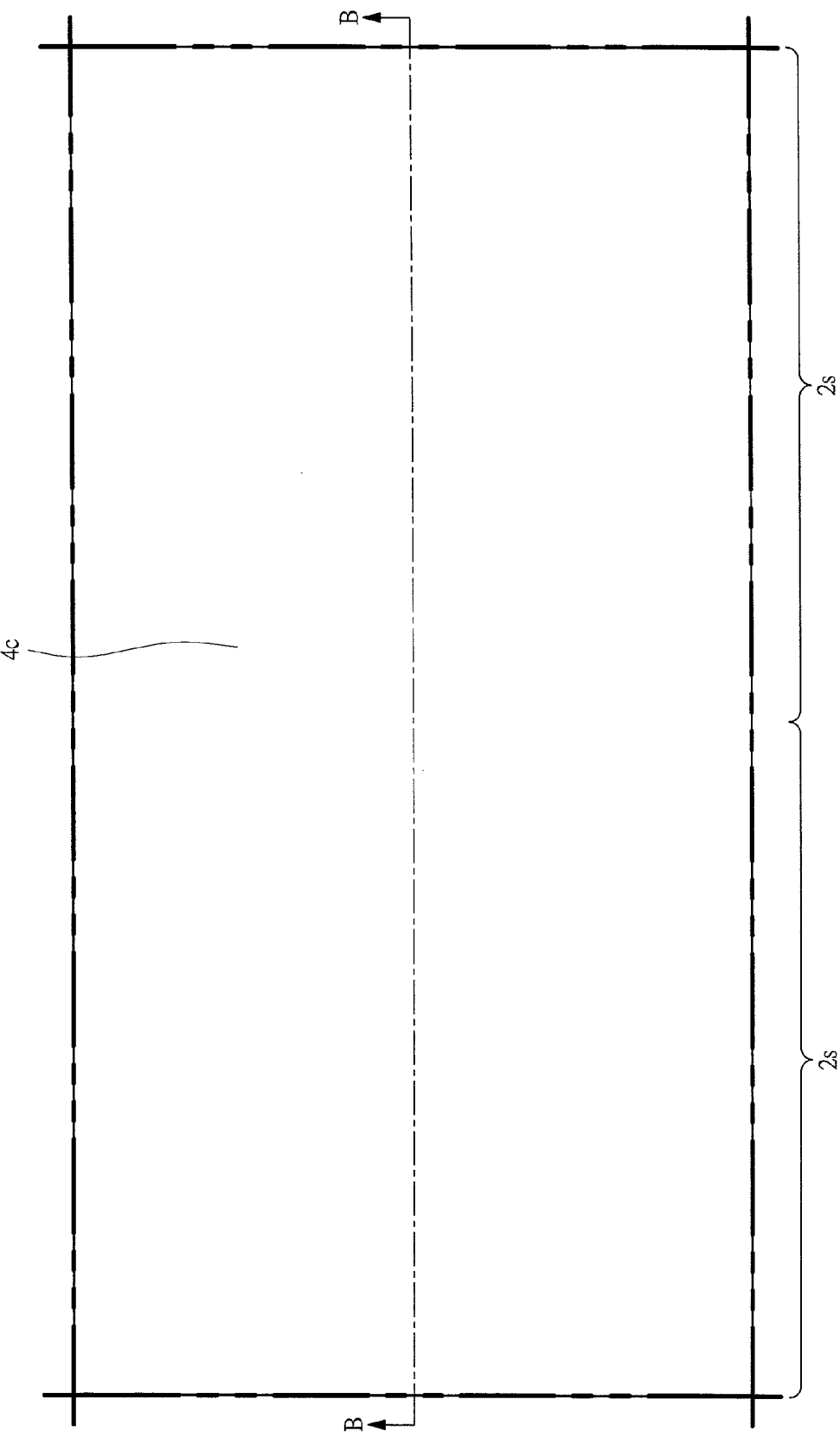
FIG. 18 is a partial plan view showing one example of a structure after resin molding in the assembling process of the semiconductor device of FIG. 1.
Figure 19:
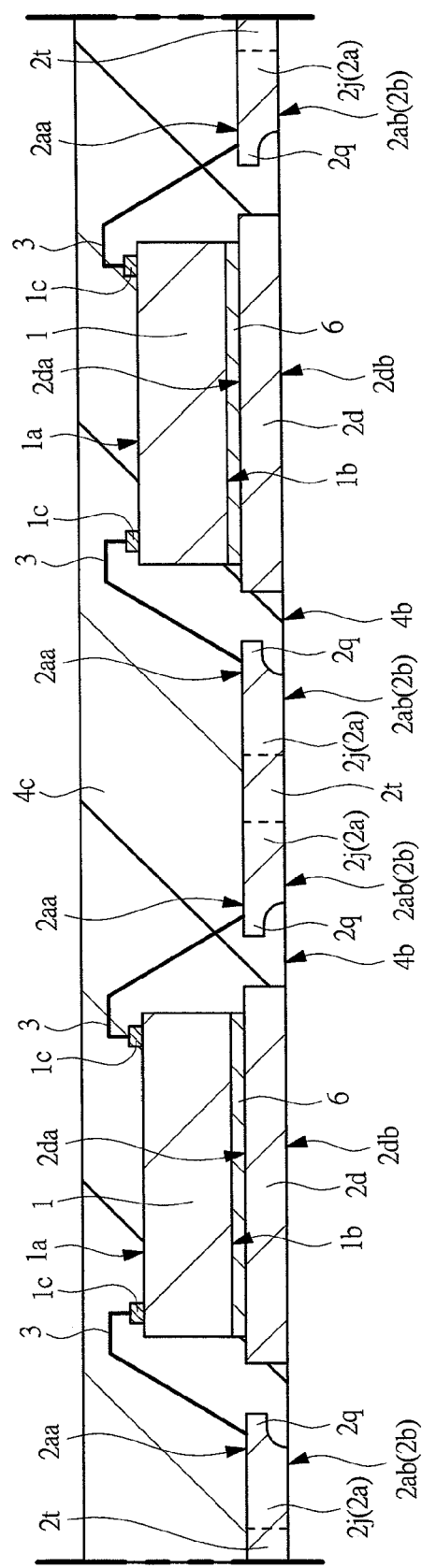
FIG. 19 is a partial cross-sectional view showing one example of the structure taken along the line B-B of FIG. 18.
Figure 20:
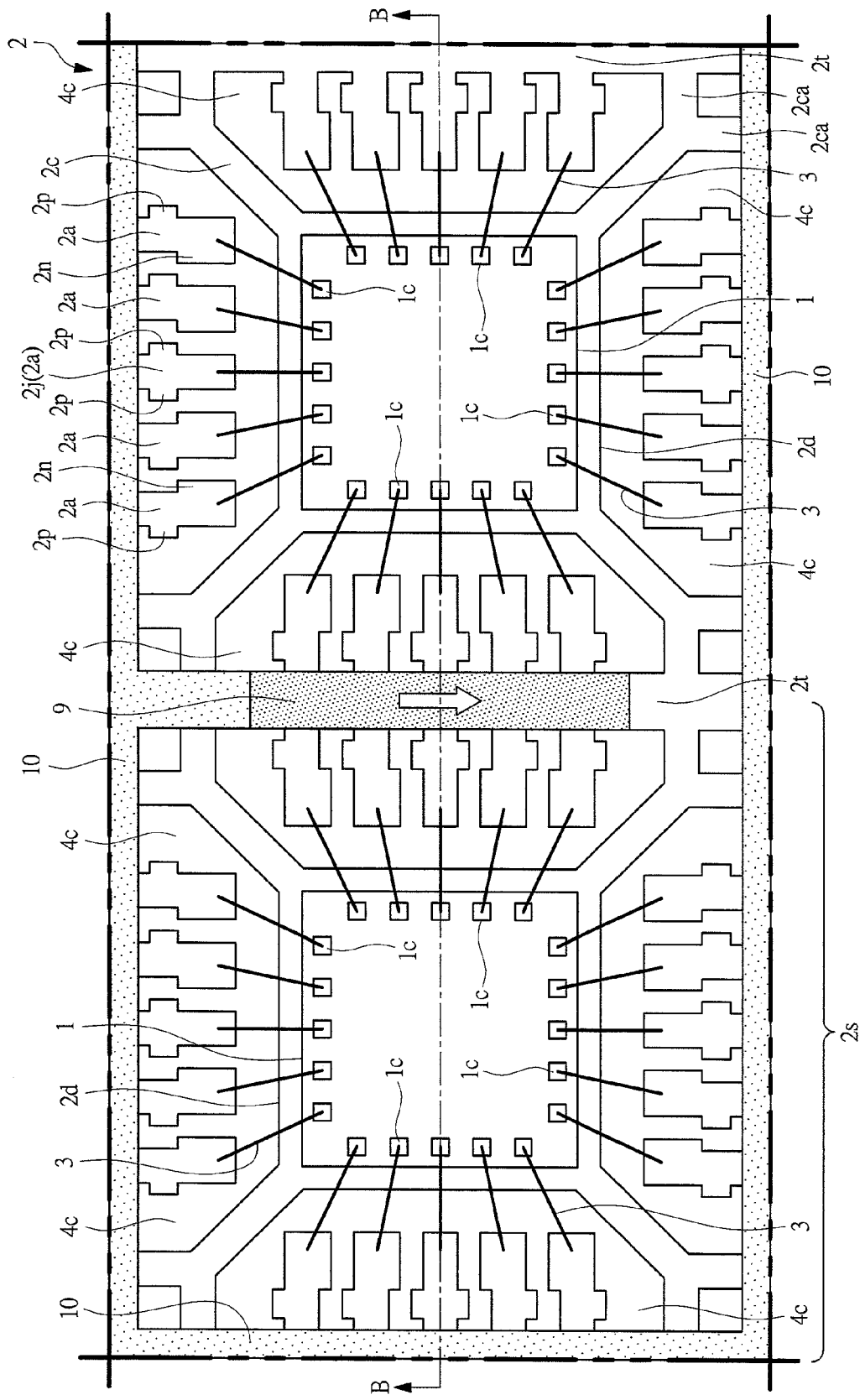
FIG. 20 is a partial plan view showing one example of a structure at the time of dicing in the assembling process of the semiconductor device of FIG. 1.
Figure 21:
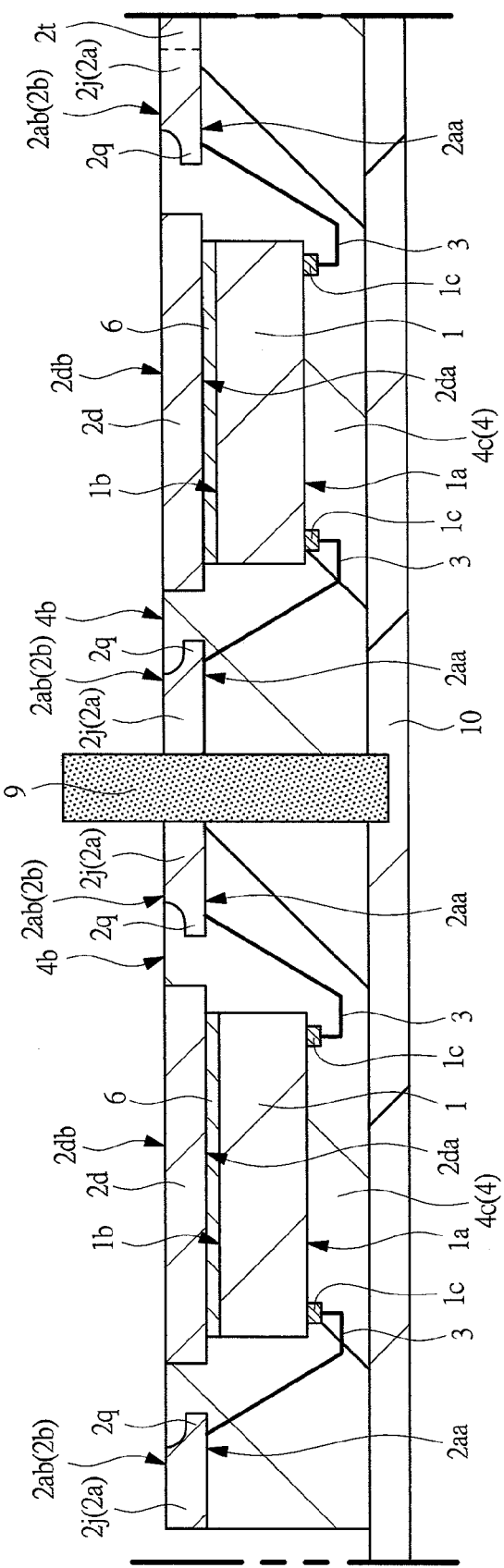
FIG. 21 is a partial cross-sectional view showing one example of the structure taken along the line B-B of FIG. 20.

FIG. 11 is a partial plan view showing one example of a lead frame structure to be used for an assembling process of the semiconductor device of FIG. 1, FIG. 12 is a partial cross-sectional view showing one example of the structure taken along the line B-B of FIG. 11, FIG. 13 is a partial plan view showing one example of a structure after die bonding in the assembling process of the semiconductor device of FIG. 1, and FIG. 14 is a partial cross-sectional view showing one example of the structure taken along the line B-B of FIG. 13. Moreover, FIG. 15 is a partial plan view showing one example of a structure after wire bonding in the assembling process of the semiconductor device of FIG. 1, FIG. 16 is a partial cross-sectional view showing one example of the structure taken along the line B-B of FIG. 15, and FIG. 17 is a partially enlarged plan view showing a structure of an X portion of FIG. 15. Furthermore, FIG. 18 is a partial plan view showing one example of a structure after resin molding in the assembling process of the semiconductor device of FIG. 1, FIG. 19 is a partial cross-sectional view showing one example of the structure taken along the line B-B of FIG. 18, FIG. 20 is a partial plan view showing one example of a structure at the time of dicing in the assembling process of the semiconductor device of FIG. 1, and FIG. 21 is a partial cross-sectional view showing one example of the structure taken along the line B-B of FIG. 20.

First, a thin plate-like lead frame 2 in which a plurality of device areas 2s as shown in FIG. 11 are formed is prepared. The device area 2s is an area in which one QFN 5 is formed as described above, and the assembling process utilizing the so-called batch molding method in which a plurality of device areas 2s are molded with resin at a time will be described here.

As shown in FIG. 11 and FIG. 12, the lead frame 2, which has one die pad (chip mounting portion) 2d, a plurality of suspension leads 2c for supporting the die pad 2d, and a plurality of leads 2a that are arranged adjacent to (around) the die pad 2d and located between the adjacent suspension leads 2c out of the plurality of suspension leads 2c, is prepared. In other words, the die pad 2d is located among the plurality of leads 2a.

Each of the device areas 2s is surrounded by a frame portion 2t, and the plurality of leads 2a and the plurality of suspension leads 2c are supported by the frame portion 2t.

As the lead frame 2 of the present first embodiment, the structure in which five (odd number) leads 2a are formed between the mutually adjacent suspension leads 2c in each of device areas 2s will be described. First, each of the plurality of leads 2a including the central lead 2j on each side includes the lower surface 2ab, the upper surface 2aa, the inner end surface 2g and the outer end surface 2f shown in FIG. 5 and the side surface 2h and the side surface 2i shown in FIG. 6, and moreover, the lead 2a includes the tip portion 2k located on the inner end surface 2g side and the rear end portion 2m located on the outer end surface 2f side in the extending direction 2w of the lead 2a as shown in FIG. 6.

Moreover, on the side surface 2h of the tip portion 2k of each of the plurality of leads 2a except for the central lead 2j on each side, the projecting step portion 2n toward the central lead 2j is formed (hatched portion shown in FIG. 6). On the other hand, on the side surface 2i of the rear end portion 2m of each of the plurality of leads 2a except for the central lead 2j, a projecting step portion 2p in a direction away from the central lead 2j (hatched portion shown in FIG. 6) is formed.

In addition, on each of the plurality of leads 2a except for the central lead 2j, none of the step portion 2n and the step portion 2p is formed on the side surface 2h of the rear end portion 2m. Moreover, none of the step portion 2n and the step portion 2p is formed on the side surface 2i of the tip portion 2k. More specifically, on each of the plurality of leads 2a except for the central lead 2j on each side, the step portion 2n is formed only on the side surface 2h of the tip portion 2k, and the step portion 2p is formed only on the side surface 2i of the rear end portion 2m.

Moreover, on the central lead 2j on each side, as shown in FIG. 2 and FIG. 6, the step portion 2p is formed on the both side surfaces 2h and 2i of rear end portion 2m. More specifically, the step portion 2p is formed on each of the left and right sides of the rear end portion 2m.

As described above, in the lead frame 2 to be used for the assembling process of the QFN 5 of the present first embodiment, in each of the device areas 2s shown in FIG. 11, respective step portions 2n and step portions 2p are formed such that the lead pattern of the five leads 2a of each side seen in a plan view forms a line symmetrical shape with respect to the central lead 2j and the plurality of leads 2a on the left and right sides of the central lead 2j.

Moreover, the lead pattern of the lead frame 2 is formed by etching process.

Thereafter, a die bonding process is carried out. In the die bonding process, as shown in FIG. 13 and FIG. 14, the semiconductor chip 1 is mounted on the upper surface 2da of the die pad 2d via a die bonding material 6.

Thereafter, a wire bonding process is carried out. In the wire bonding process, as shown in FIG. 15 and FIG. 16, the plurality of electrode pads 1c of the semiconductor chip 1 and the plurality of leads 2a are electrically connected with each other through a plurality of wires 3. In the present first embodiment, a so-called positive bonding method, in which after one portion of the wire 3 has been first connected to the electrode pad 1c of the semiconductor chip 1, the other portion of the wire 3 is connected to the lead 2a, is adopted. More specifically, the electrode pad 1c of the semiconductor chip 1 serves as a $1^{st}$ side, and the lead 2a serves as a $2^{nd}$ side. As described above, in the present first embodiment, as shown in FIG. 17, the step portion 2n is formed on the side surface 2h on the same side as the extending direction 8 of the wire 3, and it is located on the side surface 2h of the tip portion 2k shown in FIG. 6. More specifically, since the step portion 2n is formed on the incident angle side of the wire 3, it is possible to prevent a capillary (not shown) that slides on the lead 2a from dropping off from the lead 2a when carrying out a wire bonding process to each of the leads 2a other than the central lead 2j among the plurality of leads 2a. In other words, since the capillary slides on the $2^{nd}$ bonding side, it is possible to more easily carry out the wire bonding process on the $2^{nd}$ side (lead side) when the step portion 2n is disposed so as to correspond to the extending direction 8 of the wire 3.

Thereafter, a resin molding process is carried out. Since the assembling process of the QFN 5 of the present first embodiment is carried out by the batch molding method, the semiconductor chip 1 and the plurality of wires 3 are sealed with resin in this molding process, thereby forming a batch sealing member 4c on the lead frame 2 as shown in FIG. 18 and FIG. 19. At this time, the semiconductor chip 1, the inner portions 2e of the leads 2a and the plurality of wires 3 are sealed with resin such that the lower surface (one portion (mounting surface) of the outer portion 2b) 2ab of each of the leads 2a is exposed from the lower surface 4b of the batch sealing member 4c in each of the device areas 2s.

After completion of the resin molding process, a dicing process (package dicing) into each of packages is carried out and the assembling process of the QFN 5 shown in FIGS. 1 to 5 is completed. As shown in FIG. 20 and FIG. 21, the dicing process is carried out by using a dicing blade 9. More specifically, as shown in FIG. 21, a dicing tape 10 is bonded onto the front surface side of the batch sealing member 4c, and the batch sealing member 4c is cut by the blade 9 that proceeds thereinto from the lead frame side (from above), with the batch sealing member 4c being in a longitudinally reversed state. In this case, the dicing tape 10 is not completely cut but is partly left, thereby maintaining the state in which the respective packages (QFN 5) are bonded onto the dicing tape 10 so as not to be scattered until the packages are picked up in the next picking-up process.

According to the QFN 5 of the present first embodiment, since the step portions 2n and 2p are formed at shifted positions on the left and right sides of each of the leads 2a, the positions of the step portions 2n and 2p can be shifted relative to the adjacent leads 2a, and the gap between the adjacent leads 2a can be narrowed as small as possible.

Therefore, the gap between the adjacent leads 2a can be made smaller, and thus the miniaturization or the increase in the number of pins of the QFN 5 can be achieved.

Also, when attention is focused only on the reduction of the gap between the leads 2a (lead pitch), the same effect can be obtained in an SON (Small Outline Non-leaded Package) in which a plurality of external terminals are arranged along two opposed sides of the lower surface 4b of the sealing member 4, but when the expansion of the gap with the suspension lead 2c is also considered, the structure of the QFN 5 of the present first embodiment is more effective.

Moreover, by forming the step portions 2n and 2p on the left and right sides of each of the leads 2a, each lead 2a is allowed to have an anchor effect to the sealing member 4, and dropping off of the lead 2a from the sealing member 4 in the QFN 5 can be prevented or reduced. As a result, measures against dropping off of the leads 2a can be achieved.

Furthermore, with respect to the central lead 2j of each side, since the step portion 2p is formed on each of the left and right sides of the rear end portion 2m, dropping off of the central lead 2j from the sealing member 4 can be prevented or reduced.

Moreover, the step portion 2p formed on the side surface 2i of each of the plurality of leads 2a and the step portions 2p on the left and right sides of the central lead 2j on each side are both designed to be terminated inside the sealing member 4. In other words, in all the leads 2a on each side, the step portions 2p of the respective rear end portions 2m are terminated within a range that does not reach (that is not exposed from) the side surface 4a of the sealing member 4, and thus, dropping off of the lead 2a from the sealing member 4 in the lead extending direction (extending direction 2w of the lead 2a shown in FIG. 6) can be prevented or reduced.

Moreover, since the step portion 2q that is continuous with the inner end surface 2g is formed on the lower surface 2ab of the tip portion 2k of each of the plurality of leads 2a on each side, it is possible to further increase the strength of the lead 2a against dropping off from the sealing member 4 in the package height (thickness) direction.

Furthermore, since the step portions 2n, 2p and 2q of each of the leads 2a (the lead pattern of the lead frame 2) are formed by an etching process, the projecting surface 2r of each of the step portions 2n, 2p and 2q can be formed into a surface having a curvature. In this manner, because of the curvature prepared therein, the amount of sealing resin to be filled in a lower portion of the projecting surface 2r can be increased in the resin sealing process in comparison with the projecting surface formed by using a pressing treatment or the like.

Consequently, in comparison with the step portion formed by the pressing treatment, the anchor effect can be further improved, and the dropping off of each of the leads 2a from the sealing member 4 can be further prevented or reduced.

Moreover, since the lead frame 2 is formed by using the etching process, a greater anchor effect can be produced even with a smaller projecting amount in comparison with the pressing treatment. Therefore, the projecting amount of the step portions 2n and 2p can be reduced, and as a result, since the gap between the adjacent leads 2a can be made as small as possible, it becomes possible to achieve the miniaturization or the increase in the number of pins of the QFN 5.

Next, a modified example of the present first embodiment will be described.

Figure 22:
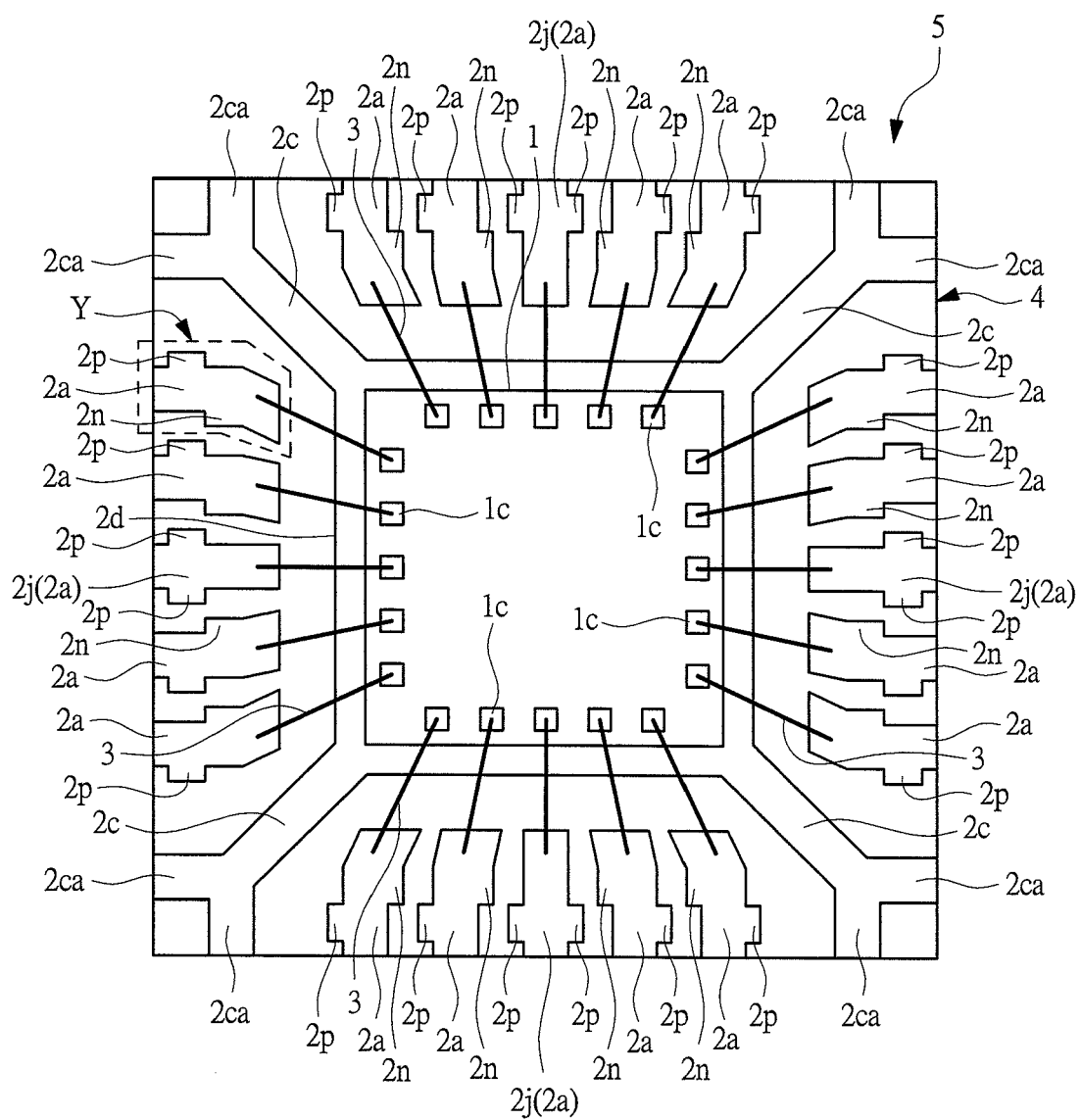
FIG. 22 is a plan view showing the structure of a semiconductor device of a modified example 1 of the first embodiment of the present invention in a transparent manner through a sealing member.
Figure 23:
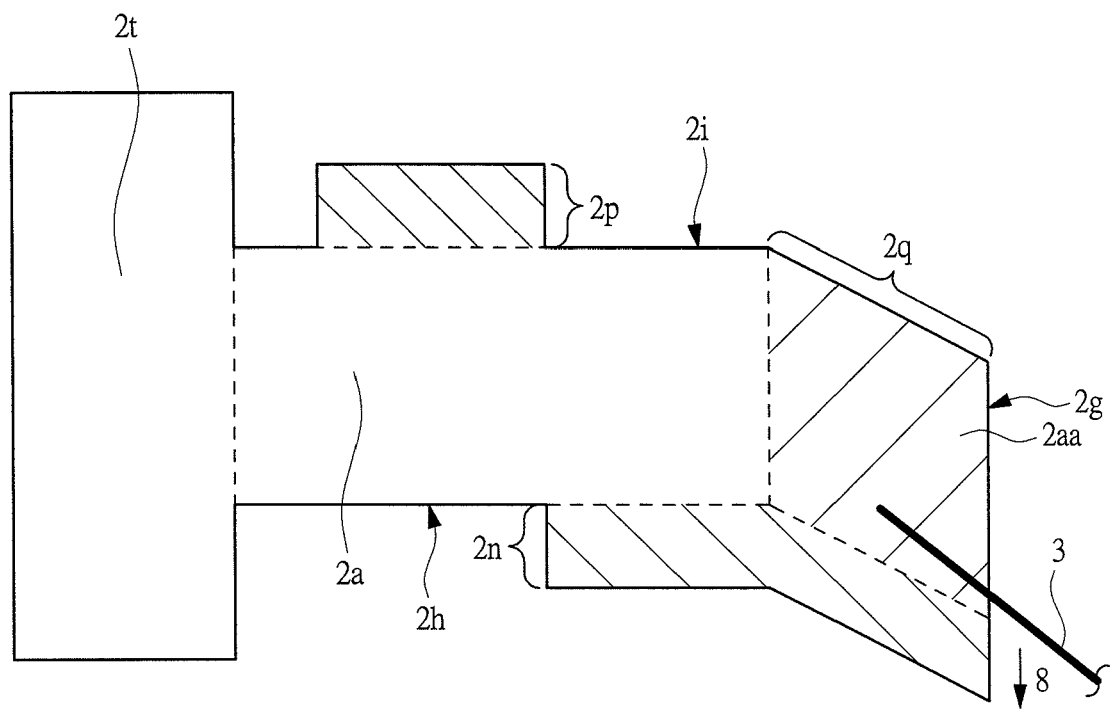
FIG. 23 is a partially enlarged plan view showing a structure corresponding to a Y portion of FIG. 22 after wire bonding.
Figure 24:
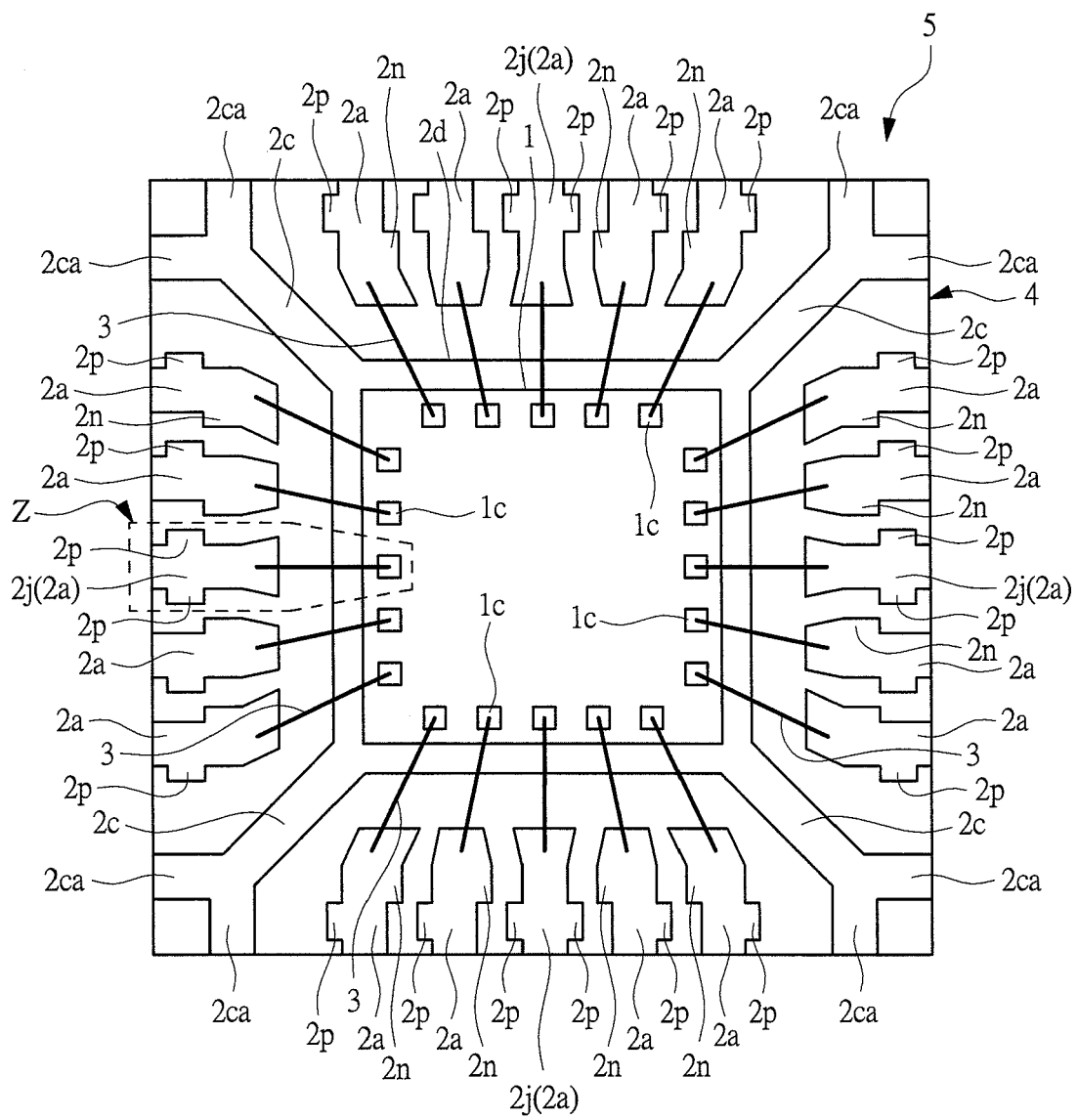
FIG. 24 is a plan view showing the structure of a semiconductor device of a modified example 2 of the first embodiment of the present invention in a transparent manner through a sealing member.
Figure 25:
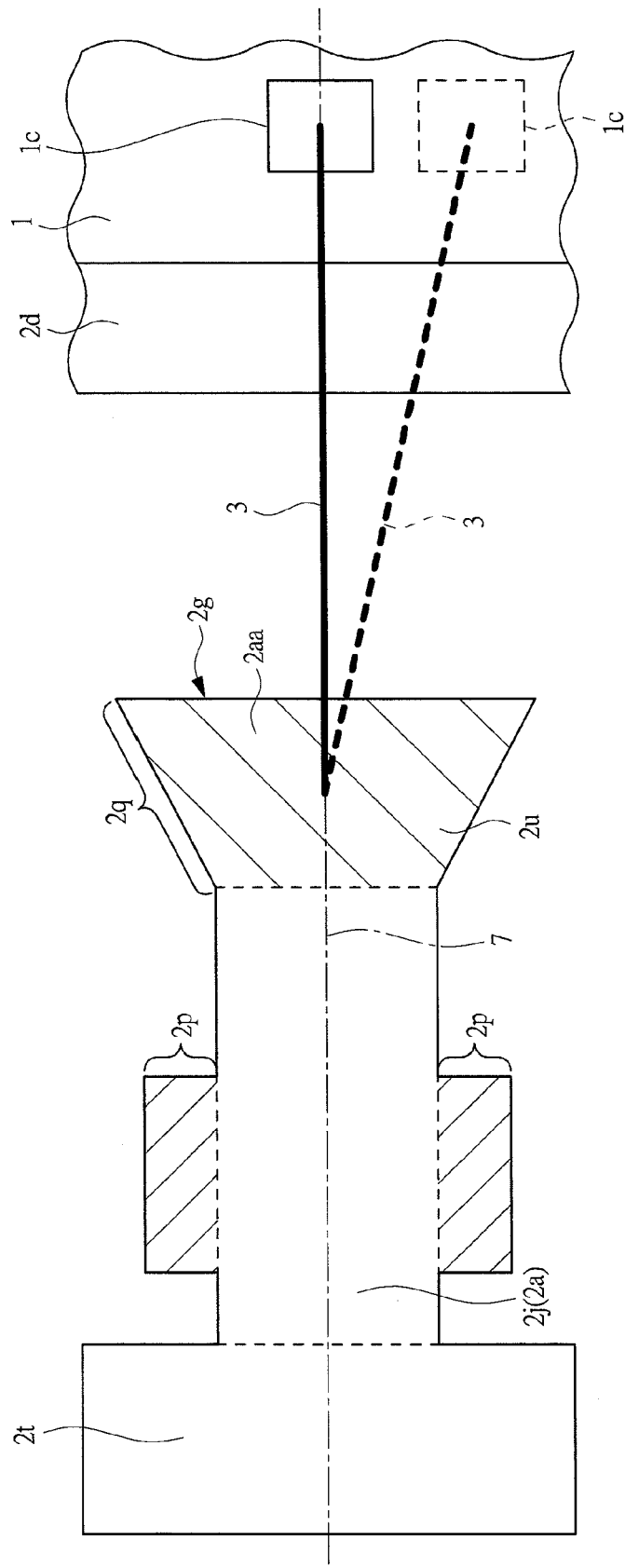
FIG. 25 is a partially enlarged plan view showing a structure corresponding to a Z portion of FIG. 24 after wire bonding.

FIG. 22 is a plan view showing the structure of a semiconductor device of a modified example 1 of the first embodiment of the present invention in a transparent manner through a sealing member, FIG. 23 is a partially enlarged plan view showing a structure corresponding to a Y portion of FIG. 22 after wire bonding, FIG. 24 is a plan view showing the structure of a semiconductor device of a modified example 2 of the first embodiment of the present invention in a transparent manner through a sealing member, and FIG. 25 is a partially enlarged plan view showing a structure corresponding to a Z portion of FIG. 24 after wire bonding.

In the lead shape of the modified example 1 shown in FIG. 22, each of the leads 2a except for the central lead 2j among the plurality of leads 2a of each side has an inner end portion which is formed into a bent shape along the extending direction 8 of the wire 3 when seen in a plan view as shown in FIG. 23.

More specifically, the inner end portion of each of the leads 2a except for the central lead 2j of each side is bent along the wiring direction (extending direction 8 of the wire 3), and the degree of bend of the inner end portion relative to the outer end portion becomes greater in the lead 2a located closer to the suspension lead 2c (located closer to the end portion of the lead array) among the plurality of leads 2a arranged along each side.

In this manner, the extension of the wire 3 can be limited within the lead width of the lead tip portion, and the sliding area of the capillary (not shown) at the time of $2^{nd}$ bonding can be ensured, and the $2^{nd}$ bonding can be easily carried out. Also, the hatched portions shown in FIG. 23 correspond to the areas of the step portions 2n, 2p and 2q.

Next, in the lead shape of the modified example 2 shown in FIG. 24, a wide portion 2u having a large width in its plan view is formed on the inner end portion of the central lead 2j among the plurality of leads 2a of each side. The width of the wide portion 2u is larger than the width of a portion of the lead 2j in which no step portion 2p is formed shown in FIG. 25. Additionally, as shown in FIG. 25, the electrode pad 1c of the semiconductor chip to be electrically connected with the central lead 2j through the wire 3 is not always arranged on a center line (virtual line) 7. For this reason, the wire 3 to be connected to the central lead 2j of each side sometimes tends to deviate in either the left or right direction relative to the central lead 2j as shown in FIG. 25. Therefore, as shown in the present modified example 2, the wide portion 2u with a large width on both sides of the central line (virtual line) 7 is formed on the inner end portion of the central lead 2j such that the sliding ($2^{nd}$ bonding) of the capillary can be surely carried out even if the wiring deviates in either the left or right direction. In the example shown in FIG. 25, the shape of the inner end portion of the central lead 2j in its plan view is a reversed trapezoidal shape. Also, the hatched portions shown in FIG. 25 correspond to the areas of the step portions 2n, 2p and 2q.

Second Embodiment

Figure 26:
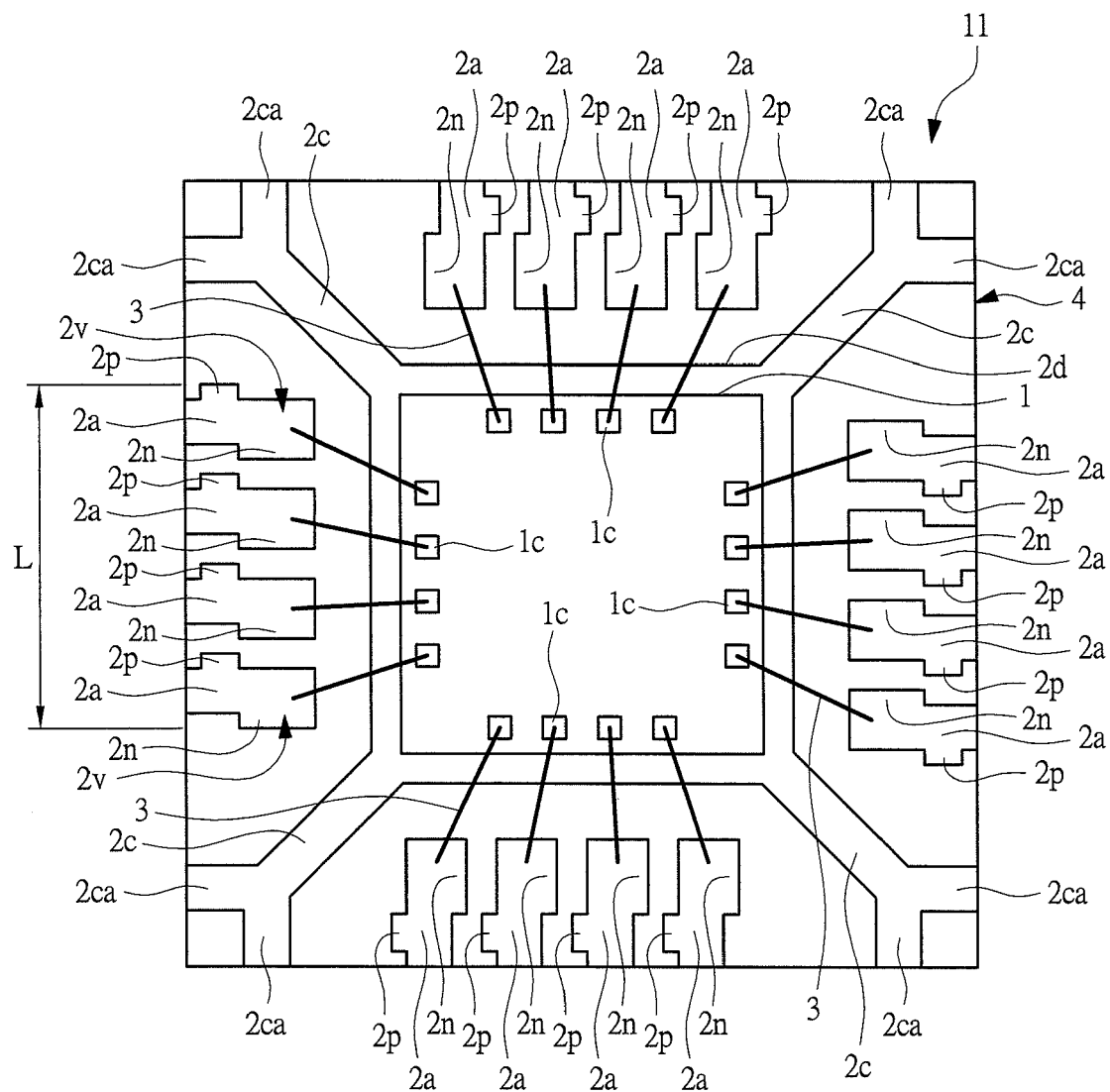
FIG. 26 is a plan view showing one example of a structure of a semiconductor device according to the second embodiment of the present invention in a transparent manner through a sealing member.

FIG. 26 is a plan view showing one example of a structure of a semiconductor device according to the second embodiment of the present invention in a transparent manner through a sealing member.

Like the QFN 5 of the first embodiment, the semiconductor device of the present second embodiment is of a peripheral type QFN 11 in which one portion of each of a plurality of leads 2a serving as external terminals is arranged on a peripheral edge portion on a rear-surface side, and this semiconductor device is different from the QFN 5 of the first embodiment in that a plurality of leads 2a are arranged such that an even number of the leads 2a are arranged along each side of the sealing member 4 when seen in a plan view.

More specifically, in the QFN 11 of the present second embodiment, an even number of the leads 2a (in this case, every four leads) are arranged on each side of the square-shaped sealing member 4 when seen in a plan view, and the step portions 2n and step portions 2p of the leads 2a are respectively formed in the same direction as the array direction of the even number of leads 2a.

Therefore, the pattern of the plurality of leads 2a on each side is the same in the array direction of the leads 2a when seen in a plan view, and the leads 2a having the same pattern are arranged side by side.

Also, since the number of leads on each side is an even number in the QFN 11, the lead corresponding to the central lead 2j placed on each side in the QFN 5 of the first embodiment is not present.

As described above, since the pattern of the plurality of leads 2a on each side in its plan view is prepared as the same pattern in the lead array direction, the image recognition when recognizing each lead 2a at the time of wire bonding can be easily carried out. More specifically, when the wire 3 is to be connected in a wire bonding process of the assembling process of the QFN 11, it is connected after the wire joint portion (tip portion 2k, first portion) 2v of each lead 2a has been image-recognized by using a recognition device (camera or the like (not shown)). Therefore, by forming the lead pattern of each of the leads 2a to have the same pattern in its plan view, the wire bonding process can be carried out more easily in comparison with the case where the wires 3 are connected to the leads 2a having different patterns.

Also, since the plurality of leads 2a on each side are formed to have the same pattern in the array direction of the leads when seen in the plan view, the length of a lead row L on each side can be shortened. In other words, by arranging the plurality of leads 2a each having the same pattern in its plan view, the lead gap can be narrowed, and thus the length of the lead row L can be shortened.

If the lead row L can be shortened, the gap between the lead 2a located at the end in the lead row and the suspension lead 2c can be ensured. Thus, since it is not necessary to make the lead 2a retreat rearward (outward) even in the case of multi pins, the package (QFN 11) can be miniaturized. In other words, the increase in the number of pins of the package (QFN 11) can be achieved.

Since the other structures of the QFN 11 of the present second embodiment are the same as those of the QFN 5 of the first embodiment, redundant descriptions thereof will be omitted.

According to the QFN 11 of the present second embodiment, since the plurality of leads 2a on each side in its plan view are formed to have the same lead pattern, the gap between the adjacent leads 2a can be further narrowed, and the miniaturization or the increase in the number of pins of the QFN 11 can be achieved.

Moreover, since the step portions 2n and 2p are formed on both of the left and right sides of each of the leads 2a, each lead 2a is allowed to have an anchor effect to the sealing member 4, and dropping off of the lead 2a from the sealing member 4 in the QFN 11 can be prevented or reduced. Thus, measures against dropping off of the leads 2a can be achieved.

Since the other effects obtained by the QFN 11 of the present second embodiment are the same as those of the QFN 5 of the first embodiment, redundant descriptions thereof will be omitted.

Furthermore, since the assembling processes of the QFN 11 of the present second embodiment are also the same as those of the QFN 5 of the first embodiment, redundant descriptions thereof will be, omitted.

In the foregoing, the invention made by the inventor of the present invention has been concretely described based on the embodiments. However, it is needless to say that the present invention is not limited to the foregoing embodiments and various modifications and alterations can be made within the scope of the present invention.

Figure 27:
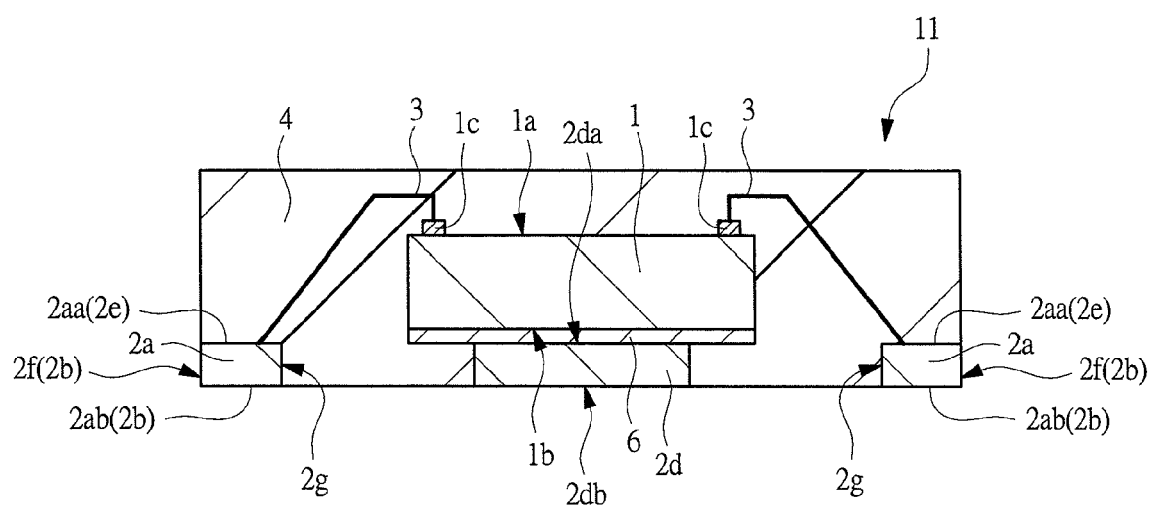
FIG. 27 is a cross-sectional view showing the structure of a semiconductor device of a modified example 1 of the present invention.
Figure 28:
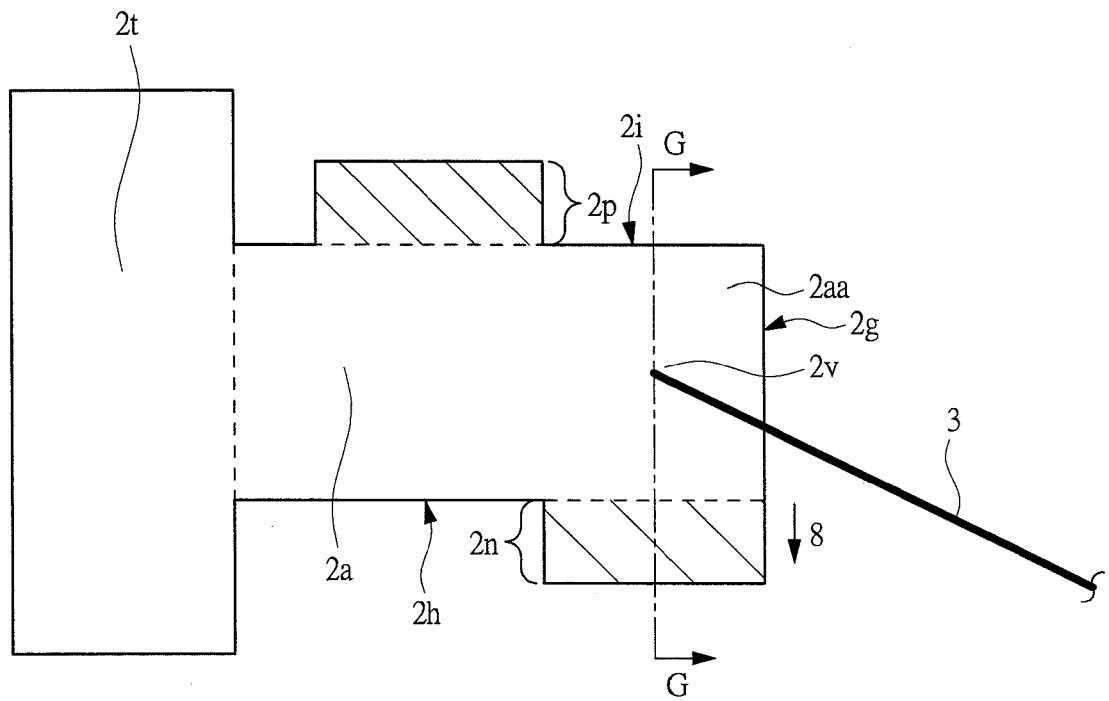
FIG. 28 is a partially enlarged plan view showing a structure after wire bonding in the assembling process of the semiconductor device of FIG. 27.
Figure 29:
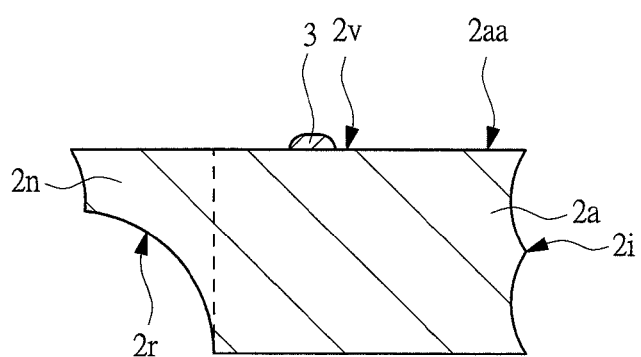
FIG. 29 is a cross-sectional view showing one example of the structure taken along the line G-G of FIG. 28.

For example, in the first and second embodiments, the structure in which the step portion 2q is formed on the lower surface 2ab side of the inner end surface 2g of each of the leads 2a has been described. However, as shown in FIGS. 27 and 28, it is not always necessary to form the step portion (projecting portion, protruding portion, eave portion) on the inner end portion. More specifically, in each of the leads 2a of a modified example 1 shown in FIGS. 27 to 29, the step portion 2n is formed on the side surface 2h of the tip portion 2k (see FIG. 6) and the step portion 2p is formed on the opposite side surface 2i of the rear end portion 2m (see FIG. 6), but no step portion is formed on the inner end portion. Therefore, the strength against the pull-out force in the package thickness direction of each of the leads 2a is slightly lowered in comparison with that of the aforementioned first and second embodiments, but the effect of preventing the dropping-off of the leads 2a can be sufficiently obtained by the step portions 2n and 2p.

Figure 30:
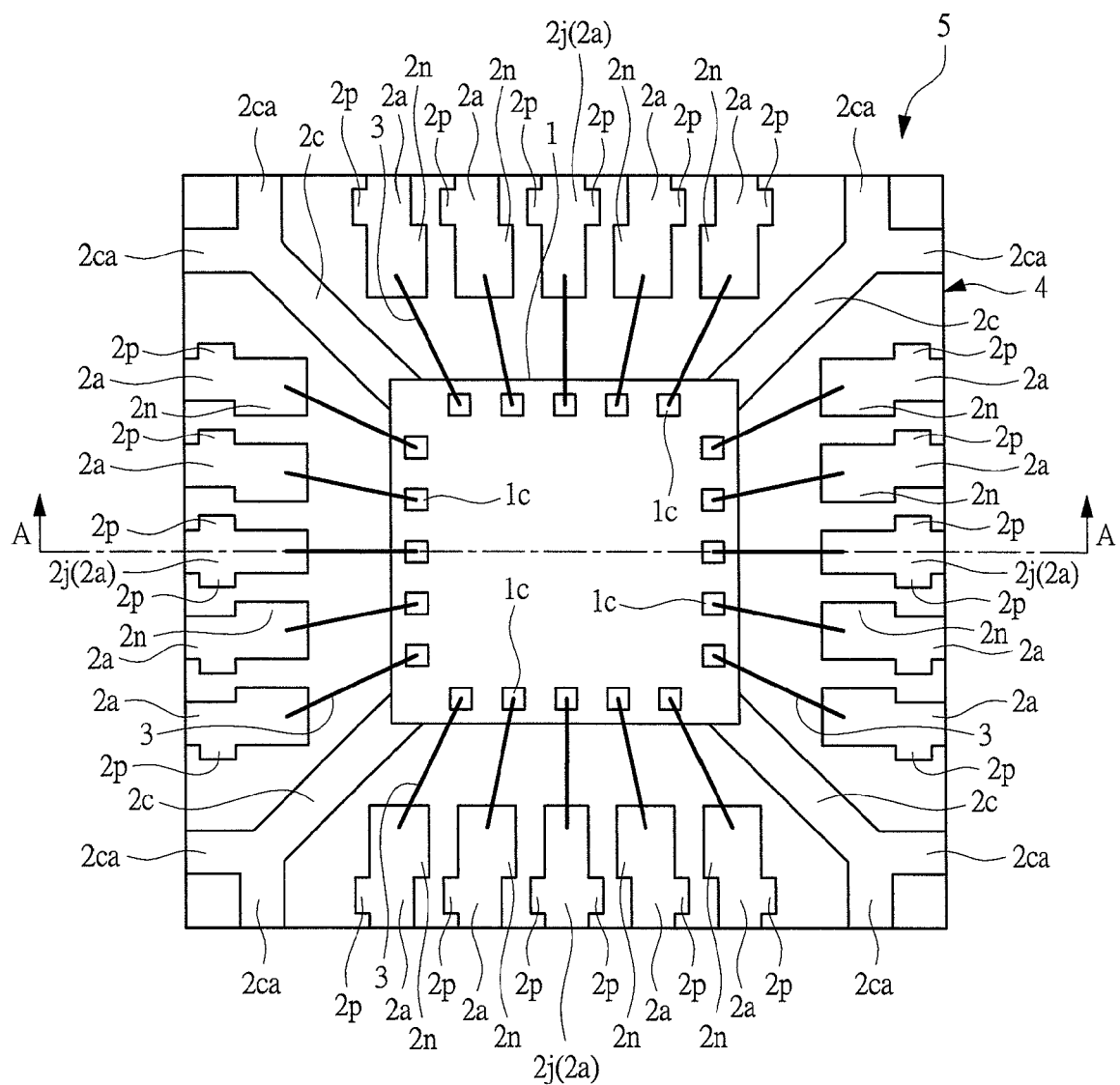
FIG. 30 is a plan view showing the structure of the semiconductor device of a modified example 2 of the present invention in a transparent manner through a sealing member.
Figure 31:
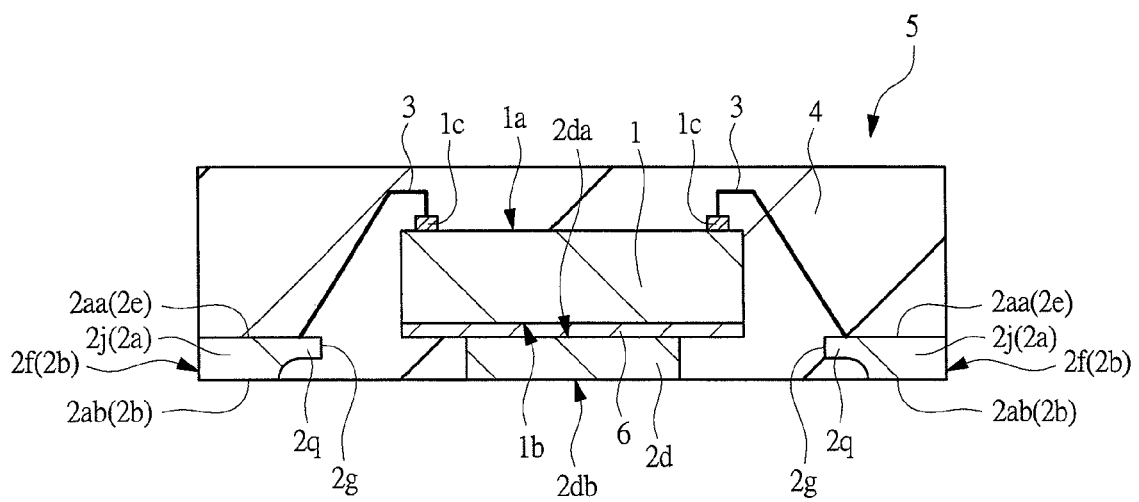
FIG. 31 is a cross-sectional view showing one example of the structure taken along the line A-A of FIG. 30.
Figure 32:
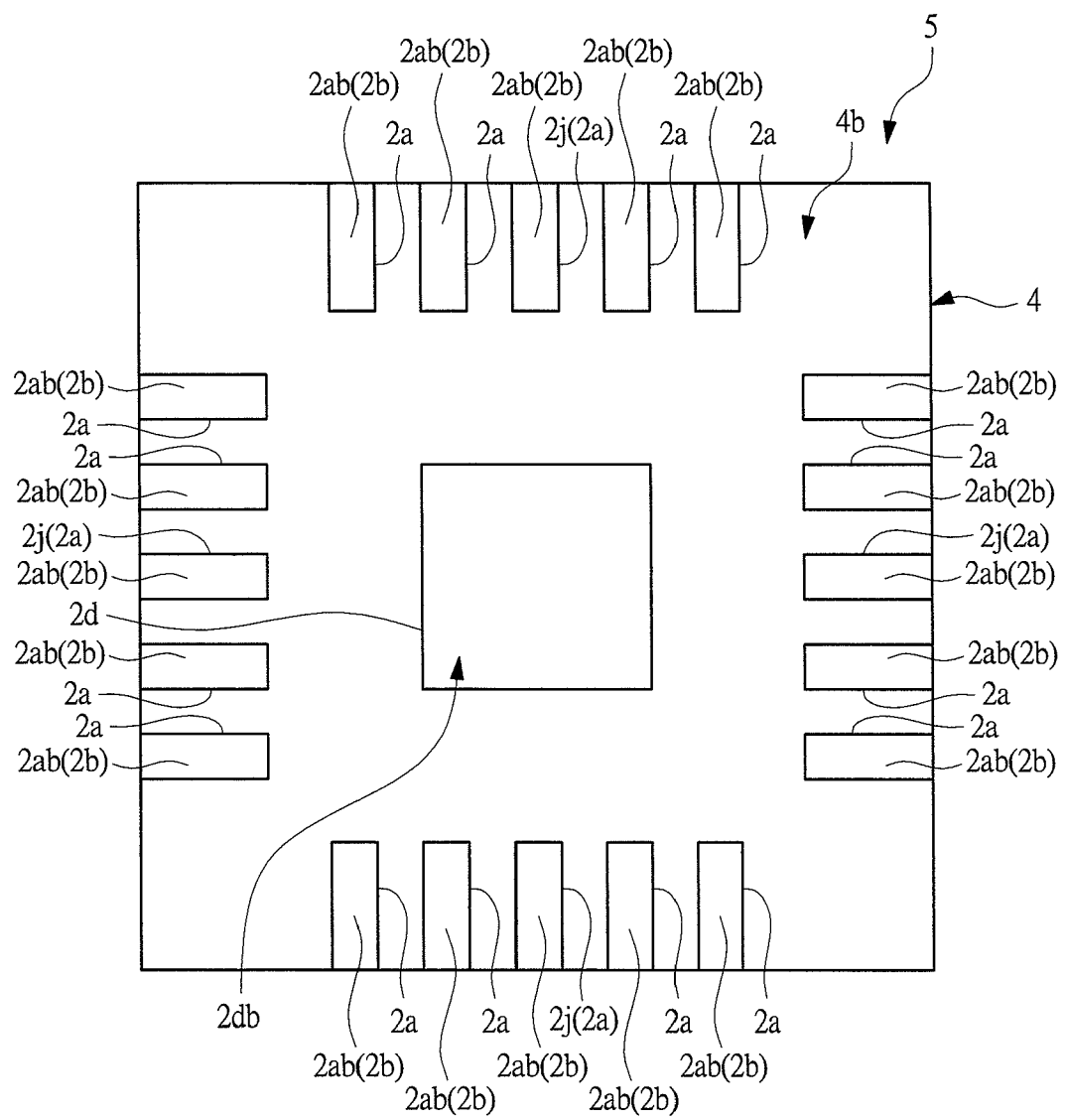
FIG. 32 is a rear-surface view showing one example of the structure of the semiconductor device of FIG. 30.

Moreover, for example, in the aforementioned first and second embodiments, the semiconductor device (QFN) having a large-tab structure has been described. However, as shown in the QFN 5 of the modified example 2 of FIGS. 30 to 32, the semiconductor device is not limited to that having the large-tab structure, and the semiconductor device may have a so-called small-tab structure in which the outside dimension (the size of the upper surface 2da of FIG. 31) of the die pad 2d is smaller than the outside dimension (the size of the rear surface 1b of FIG. 31) of the semiconductor chip 1. In other words, even in the case of the QFN 5 having the small-tab structure, the same effects as those obtained in the QFN 5 having the large-tab structure can be obtained.

Furthermore, for example, in the aforementioned first and second embodiments, the case in which the QFN 5 and the QFN 11 are of a die-pad exposed type (tab-exposed type) has been described, but the QFN 5 and the QFN 11 may be of a tab-integrated type in which the die pad (tab) 2b is embedded in the sealing member 4, or it may have a structure in which the die pad 2d is exposed from the sealing member 4 and only the suspension leads 2c are embedded in the sealing member 4.

Figure 33:
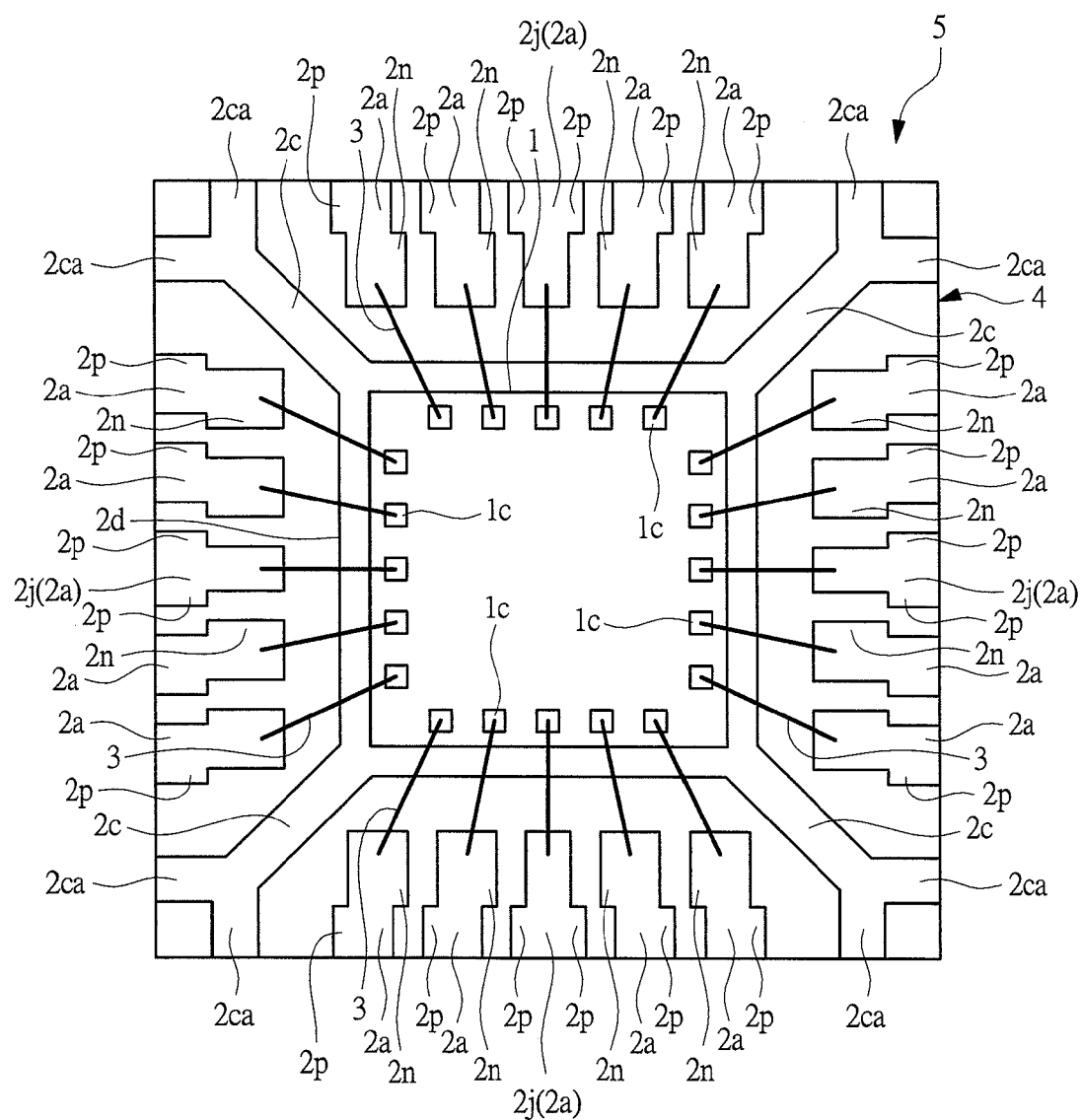
FIG. 33 is a plan view showing the structure of the semiconductor device of a modified example 3 of the present invention in a transparent manner through a sealing member.
Figure 34:
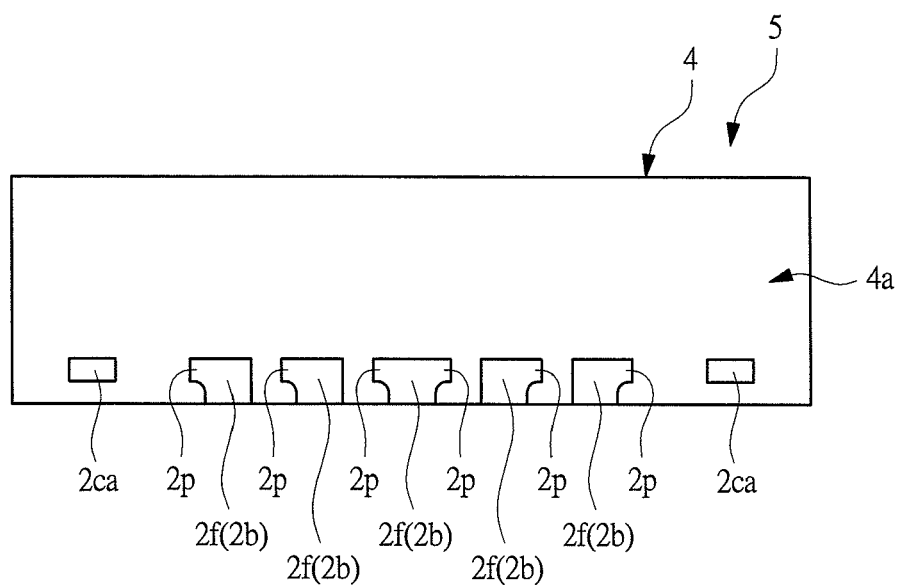
FIG. 34 is a side view showing one example of the structure of the semiconductor device of FIG. 33.

For example, in the aforementioned first and second embodiments, the step portion 2p of the rear end portion 2m in each of the leads 2a of the semiconductor device (QFN 5, 11) is terminated inside the sealing member 4. In other words, the case in which the step portion 2p formed on each of the leads 2a is not exposed from the side surface of the sealing member 4 has been described. However, as shown in QFN 5 of FIG. 33 and FIG. 34, the step portion 2p may reach the side surface 4a to be exposed therefrom without being terminated inside the sealing member 4. Therefore, the strength against the pull-out force in the lead extending direction is slightly lowered in comparison with that of the aforementioned first and second embodiments, but the effect of preventing the dropping-off of the leads 2a can be sufficiently obtained by the step portions 2n and 2p.

Furthermore, for example, in the aforementioned first and second embodiments, the case where the semiconductor device is a QFN has been described. However, the semiconductor device is not limited to the QFN, but it may be prepared as, for example, an SON or the like in which a plurality of outer portions 2b serving as external terminals are arranged along two opposed sides out of four sides of a lower surface 4b of the sealing member 4.

The present invention can be applied to a semiconductor device that is assembled by using a lead frame.

What is claimed is:

1. A semiconductor device comprising:
   a die pad;
   a plurality of suspension leads for supporting the die pad;
   a plurality of leads arranged between the plurality of suspension leads;
   a semiconductor chip including a main surface, a plurality of electrode pads formed on the main surface, and a rear surface opposite to the main surface, and mounted on an upper surface of the die pad;
   a plurality of wires electrically connecting the plurality of electrode pads of the semiconductor chip with the plurality of leads, respectively; and
   a sealing member sealing the semiconductor chip and the plurality of wires such that a lower surface of each of the plurality of leads is exposed,
   wherein each of the plurality of leads has the lower surface exposed from the sealing member, an upper surface opposite to the lower surface, an inner end surface located between the upper surface and the lower surface and facing the die pad, an outer end surface opposite to the inner end surface and exposed from the sealing member, a first side surface located between the upper surface and the lower surface and located between the inner end surface and the outer end surface, and a second side surface opposite to the first side surface,
   wherein each of the plurality of leads has a first portion located on an inner end surface side in an extending direction of each of the plurality of leads, and a second portion located on an outer end surface side than the first portion,
   wherein a first step portion is formed on the first side surface of the first portion, and formed on an upper surface side than the lower surface,
   wherein a second step portion is formed on the second side surface of the second portion, and formed on the upper surface side than the lower surface,
   wherein the first and second step portions are not formed on the first side surface of the second portion, and
   wherein the first and second step portions are not formed on the second side surface of the first portion.

2. The semiconductor device according to claim 1, wherein a third step portion continuous with the inner end surface is formed on the lower surface of the first portion of each of the plurality of leads.

3. The semiconductor device according to claim 2, wherein a projecting amount of the third step portion toward the die pad is larger than a projecting amount of the first step portion toward the adjacent lead and a projecting amount of the second step portion toward the adjacent lead.

4. The semiconductor device according to claim 1, wherein a planar shape of the sealing member is a square shape, and the plurality of leads are arranged such that an odd number of the leads are arranged on each side of the sealing member when seen in a plan view, and
   wherein the first and second step portions on each of the plurality of leads are formed so as to have a line symmetrical shape with respect to a central lead in the odd number of leads.

5. The semiconductor device according to claim 4, wherein a wide portion having a large width when seen in a plan view is formed on an inner end portion of the central lead.

6. The semiconductor device according to claim 4, wherein the first side surface on which the first step portion is formed is located on a side corresponding to an extending direction of the wire.

7. The semiconductor device according to claim 4, wherein among the odd number of leads on each side, each of the leads except for the lead arranged at the center has an inner end portion with a bent shape in an extending direction of the wire when seen in a plan view.

8. The semiconductor device according to claim 1, wherein a planar shape of the sealing member is a square shape, and the plurality of leads are arranged such that an even number of the leads are arranged on each side of the sealing member when seen in a plan view, and wherein the first and second step portions of each of the even number of leads on each of the sides are respectively formed in the same direction as an array direction of the even number of leads.

9. The semiconductor device according to claim 1, wherein each of the plurality of leads is formed by etching process.

10. The semiconductor device according to claim 1, wherein the second step portion formed on the second side surface of the second portion of each of the plurality of leads is terminated inside the sealing member.

* * * * *